US009570551B1

(12) United States Patent
Balakrishnan et al.

(10) Patent No.: US 9,570,551 B1
(45) Date of Patent: Feb. 14, 2017

(54) REPLACEMENT III-V OR GERMANIUM NANOWIRES BY UNILATERAL CONFINED EPITAXIAL GROWTH

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/016,875

(22) Filed: Feb. 5, 2016

(51) Int. Cl.
| | |
|---|---|
| *H01L 29/06* | (2006.01) |
| *H01L 29/16* | (2006.01) |
| *H01L 29/20* | (2006.01) |
| *H01L 29/66* | (2006.01) |
| *H01L 21/306* | (2006.01) |
| *H01L 21/308* | (2006.01) |
| *H01L 29/78* | (2006.01) |

(52) U.S. Cl.
CPC ......... *H01L 29/0673* (2013.01); *H01L 21/308* (2013.01); *H01L 21/30612* (2013.01); *H01L 29/16* (2013.01); *H01L 29/20* (2013.01); *H01L 29/66795* (2013.01); *H01L 2029/7858* (2013.01)

(58) Field of Classification Search
CPC .............................. H01L 21/84; H01L 21/845
See application file for complete search history.

(56) References Cited

U.S. PATENT DOCUMENTS

| | | | |
|---|---|---|---|
| 8,110,458 B2 | 2/2012 | Jin et al. | |
| 8,766,318 B2 | 7/2014 | Hata et al. | |
| 9,184,269 B2 | 11/2015 | Ching et al. | |
| 2014/0151639 A1* | 6/2014 | Chang | H01L 29/42392 257/27 |
| 2014/0197377 A1 | 7/2014 | Kim et al. | |
| 2015/0053928 A1 | 2/2015 | Ching et al. | |
| 2015/0162403 A1 | 6/2015 | Oxland | |
| 2015/0340457 A1* | 11/2015 | Xie | H01L 29/66545 257/288 |
| 2016/0079394 A1* | 3/2016 | Li | H01L 29/66795 257/347 |

FOREIGN PATENT DOCUMENTS

| | | |
|---|---|---|
| CN | 101685774 B | 6/2012 |
| CN | 104425495 A | 3/2015 |
| WO | 2015087230 A1 | 6/2015 |

* cited by examiner

*Primary Examiner* — Mohammad Islam
*Assistant Examiner* — Ankush Singal
(74) *Attorney, Agent, or Firm* — Scully, Scott, Murphy & Presser, P.C.; Louis J. Percello, Esq.

(57) ABSTRACT

A lateral epitaxial growth process is employed to facilitate the fabrication of a semiconductor structure including a stack of suspended III-V or germanium semiconductor nanowires that are substantially defect free. The lateral epitaxial growth process is unidirectional due to the use of masks to prevent epitaxial growth in both directions, which would create defects when the growth fronts merge. Stacked sacrificial material nanowires are first formed, then after masking and etching process to reveal a semiconductor seed layer, the sacrificial material nanowires are removed, and III-V compound semiconductor or germanium epitaxy is performed to fill the void previously occupied by the sacrificial material nanowires.

10 Claims, 21 Drawing Sheets

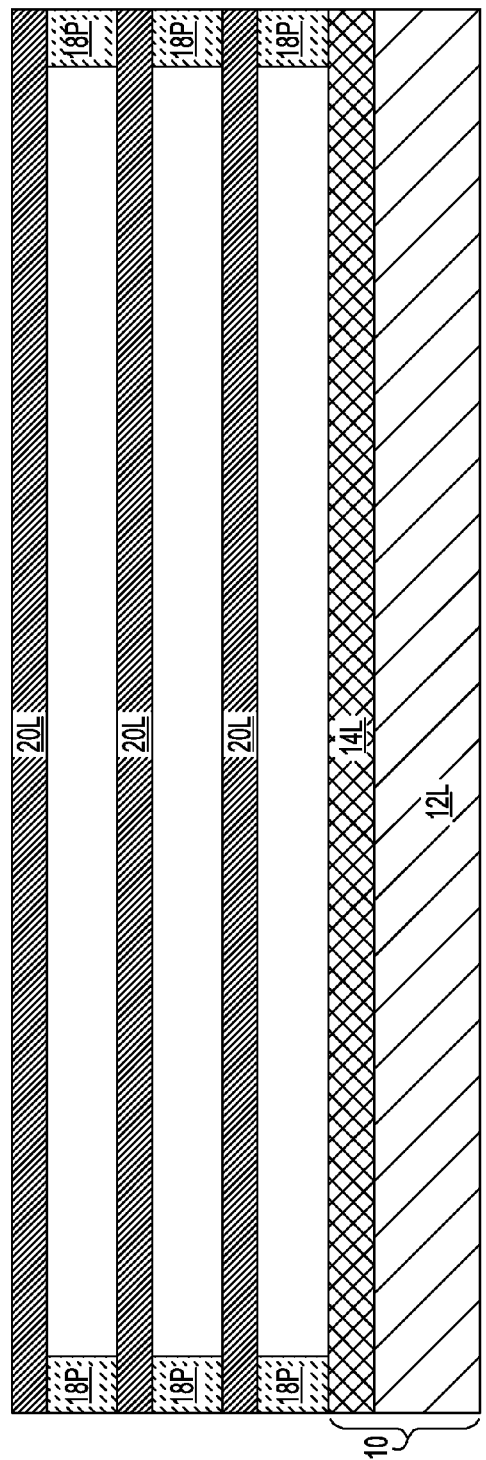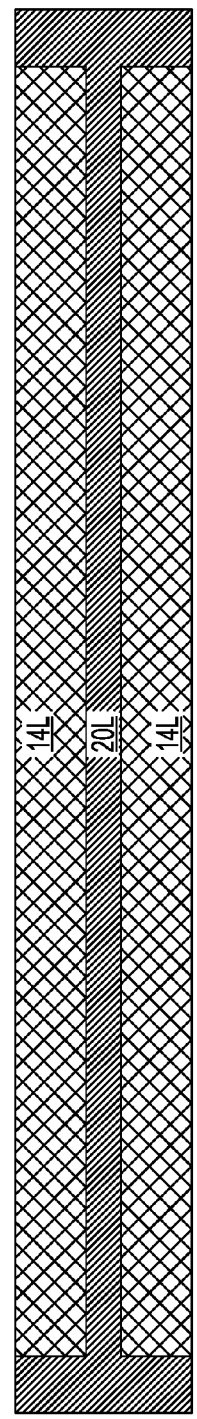
FIG. 2A
FIG. 2B

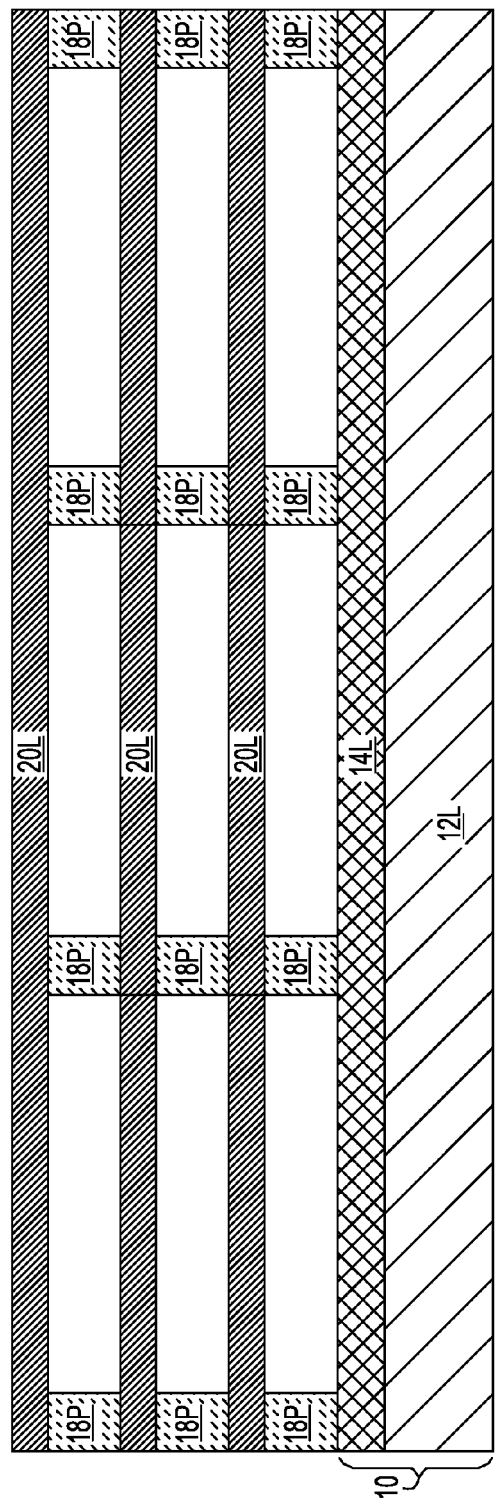
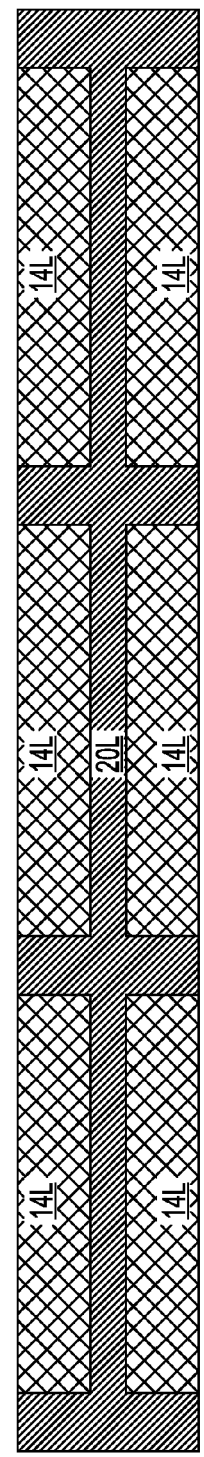
FIG. 3A
FIG. 3B

REPLACEMENT III-V OR GERMANIUM NANOWIRES BY UNILATERAL CONFINED EPITAXIAL GROWTH

BACKGROUND

The present application relates to semiconductor technology. More particularly, the present application relates to a method of forming a semiconductor structure including a stack of suspended III-V or germanium semiconductor nanowires that are formed utilizing a lateral epitaxial growth process. The present application also relates to a semiconductor structure that includes such a stack of suspended III-V or germanium semiconductor nanowires.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (finFETs) or gate-all-around semiconductor nanowire field effect transistors is the next step in the evolution of complementary metal oxide semiconductor (CMOS) devices. Such non-planar semiconductor devices can achieve higher drive currents with increasingly smaller dimensions as compared to conventional planar FETs.

Gate-all-around semiconductor nanowire field effect transistors provide superior electrostatics and higher current density per footprint than finFET devices. Gate-all-around semiconductor nanowire field effect transistors include at least one semiconductor nanowire including a source region, a drain region and a channel region located between the source region and the drain region, and a gate electrode that wraps around the channel region of the at least one semiconductor nanowire. A gate dielectric is typically disposed between the channel region of the at least one semiconductor nanowire and the gate electrode. The gate electrode regulates electron flow through the semiconductor nanowire channel between the source region and the drain region. Stacked semiconductor nanowires, in which the semiconductor nanowires are formed one atop another, afford higher density than their non-stacked semiconductor nanowire counterparts.

However, there are many process challenges which must be overcome in order to facilitate a gate-all-around semiconductor nanowire field effect transistor that contains stacked semiconductor nanowires. For example, there is a need for providing a gate-all-around semiconductor nanowire field effect transistor in which a stack of a III-V or germanium (Ge) channel material is employed since such channel materials have high mobility for electrons and holes as compared with silicon (Si) channel materials.

SUMMARY

The present application provides a lateral epitaxial growth process to facilitate the fabrication of a semiconductor structure including a stack of suspended III-V or germanium semiconductor nanowires that are substantially defect free. The lateral epitaxial growth process is unidirectional due to the use of masks to prevent epitaxial growth in both directions, which would create defects when the growth fronts merge. Stacked sacrificial material nanowires are first formed, then after masking and etching process to reveal a semiconductor seed layer, the sacrificial material nanowires are removed, and III-V compound semiconductor or germanium epitaxy is performed to fill the void previously occupied by the sacrificial material nanowires.

One aspect of the present application relates to a method of forming a semiconductor structure. In one embodiment of the present application, the method includes providing an insulator structure located on a surface of a semiconductor material and containing a first end portion having a non-recessed surface, a middle portion having a recessed surface and a second end portion having the non-recessed surface, wherein a patterned structure comprising alternating layers of dielectric material nanowire pillar portions and sacrificial material nanowire portions, and capped with a hard mask material nanowire portion, is present on each of the first and second end portions of the insulator structure. Next, a barrier material is formed extending upwards from a portion of the recessed surface of the middle portion of the insulator structure. Each sacrificial material nanowire portion is then removed from the patterned structure to provide a void. Next, a III-V or germanium semiconductor nanowire is formed in each of the voids. A source/drain semiconductor material structure is then epitaxially grown from exposed sidewalls of each of the III-V or germanium semiconductor nanowires. Next, each hard mask material nanowire portion and each dielectric material nanowire pillar portion are removed to provide a gate cavity. A functional gate structure is then formed surrounding a portion of each of the III-V or germanium semiconductor nanowires in each gate cavity.

Another aspect of the present application relates to a semiconductor structure. In one embodiment of the present application, the semiconductor structure includes an insulator structure located on a surface of a semiconductor material and containing a first end portion having a non-recessed surface, a middle portion having a recessed surface, and a second end portion having the non-recessed surface. A plurality of suspended and stacked III-V or germanium semiconductor nanowires is located atop the first and second end portions of the insulator structure. A functional gate structure surrounds a portion of each suspended and stacked III-V or germanium semiconductor nanowire located atop the first and second end portions of the insulator structure. The structure further includes a source/drain semiconductor material structure located on each side of the functional gate structure and directly contacting a sidewall of each suspended and stacked III-V or germanium semiconductor nanowire. Also, a barrier material extends upward from the recessed surface of the insulator structure and separates one of the source/drain semiconductor material structures of one of the functional gate structures from another of the source/drain semiconductor material structures of another of the functional gate structures.

BRIEF DESCRIPTION OF SEVERAL VIEWS OF THE DRAWINGS

FIG. 2A is a cross sectional view of the exemplary semiconductor structure of FIG. 1 after patterning the material stack and releasing a portion of each second sacrificial material layer by selectively removing a portion of each first sacrificial material layer, in accordance with one embodiment of the present application.

FIG. 2B is a top-down view of the exemplary semiconductor structure shown in FIG. 2A.

FIG. 3A is a cross sectional view of the exemplary semiconductor structure of FIG. 1 after patterning the material stack and releasing a portion of each second sacrificial material layer by selectively removing a portion of each first sacrificial material layer, in accordance with another embodiment of the present application.

FIG. 3B is a top-down view of the exemplary semiconductor structure shown in FIG. 3A.

DETAILED DESCRIPTION

Figure 1:
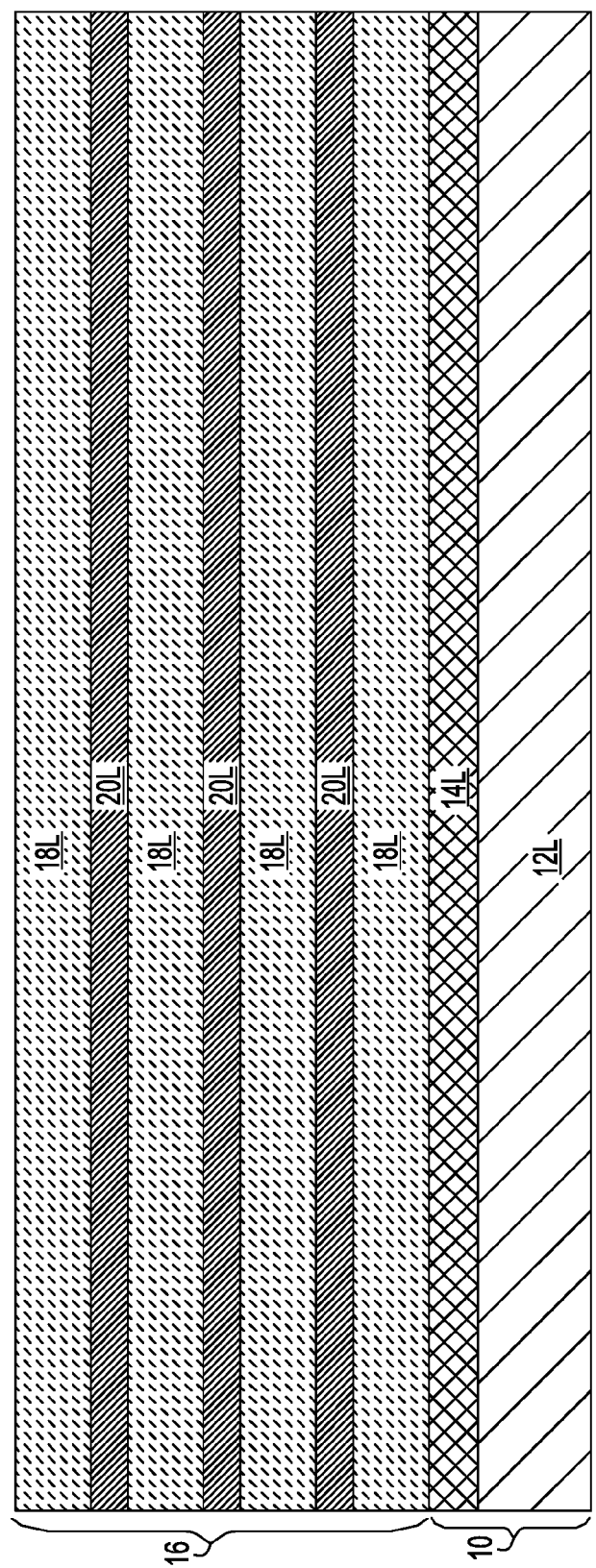
FIG. 1 is a cross sectional view of an exemplary semiconductor structure including a material stack located on a surface of a substrate, the material stack including a plurality of second sacrificial material layers, each second sacrificial material layer is sandwiched between first sacrificial material layers.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a material stack 16 located on a surface of a substrate 10, the material stack 16 includes a plurality of second sacrificial material layers 20L, each second sacrificial material layer 20L is sandwiched between first sacrificial material layers 18L. Stated in other term, FIG. 1 shows a substrate 10 that includes a material stack 16 that includes alternating layers of a first sacrificial material layer 18L and a second sacrificial material 20L, wherein each second sacrificial material layer 20L is positioned between a lower first sacrificial material layer 18L and an upper first sacrificial material layer 18L. The number of first sacrificial material layers 18L within material stack 16 is thus one greater than the number of second sacrificial material layers 20L within material stack 16.

In one embodiment of the present application, and as is illustrated in FIG. 1, the substrate 10 includes, from bottom to top, a handle substrate 12L and an insulator layer (i.e., buried dielectric layer) 14L. Collectively, the handle substrate 12L and the insulator layer 14L are remaining components of a semiconductor-on-insulator (SOI) substrate.

In one embodiment of the present application, the handle substrate 12L may include a semiconductor material having semiconducting properties. Examples of semiconductor materials that can be used as the handle substrate 12L include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the handle substrate 12L is composed entirely of silicon.

The at least one semiconductor material that provides the handle substrate 12L may be single crystalline, polycrystalline or amorphous. In one example, the handle substrate 12L is composed of single crystalline silicon. The at least one semiconductor material that provides the handle substrate 12L may have any of the well known crystal orientations. For example, the crystal orientation of the handle substrate 12L may be {100}, {110}, or {111}. Other crystallographic orientations besides those specifically mentioned can also be used in the present application.

The insulator layer 14L of the exemplary semiconductor structure shown in FIG. 1 may be a crystalline or non-crystalline dielectric material such as an oxide and/or nitride. In one embodiment, the insulator layer 14L is a dielectric oxide such as, for example, silicon dioxide. In another embodiment of the present application, the insulator layer 14L may be a dielectric nitride such as, for example, silicon nitride or boron nitride. In yet another embodiment of the present application, the insulator layer 14L may include a stack of a dielectric oxide and a dielectric nitride. In one example, a stack of, in any order, silicon dioxide and silicon nitride or boron nitride may be employed as the insulator layer 14L. The insulator layer 14L may have a thickness from 10 nm to 200 nm, although other thicknesses that are lesser than, or greater than, the aforementioned thickness range may also be employed as the thickness of the insulator layer 14L.

In some embodiments (not shown), the substrate 10 is a bulk semiconductor substrate. By "bulk semiconductor substrate", it is meant that the entirety of the substrate 10 is composed of at least one semiconductor material such as, for example, silicon. In such an embodiment, element 14L is not present and material stack 16 is formed directly upon the topmost surface of the bulk semiconductor substrate.

The material stack 16 is present on the topmost surface of substrate 10. In the illustrated embodiment, the material stack 16 is present on the topmost surface of the insulator layer 12L. The material stack 16 includes a plurality of first sacrificial material layers 18L and a plurality of sacrificial material layers 20L stacked one atop the other and in the manner such that each second sacrificial material layer 20L is sandwiched between first sacrificial material layers 18L.

In accordance with the present application, each first sacrificial material layer 18L has a material different composition and thus an etch rate than each second sacrificial material layer 20L. In one example, each first sacrificial material layer 18L may include a silicon germanium alloy, while each second sacrificial material layer 20L may include silicon. In such an embodiment, each first sacrificial material layer 18L that includes a silicon germanium alloy can be strained. In such an embodiment, each first sacrificial material layer 18L that includes a silicon germanium alloy may have a germanium content of from 20 atomic percent to 30 atomic percent germanium. Other germanium contents that are lesser than, or greater than the aforementioned range can also be employed in embodiments in which each first sacrificial material layer 18L includes a silicon germanium alloy. Also, and in such an embodiment, the silicon that provides each second sacrificial material layer 20L may be single crystalline.

In another embodiment of the present application, each first sacrificial material layer 18L may include a dielectric material, while each second sacrificial material layer 20L may include silicon. In such an embodiment, the dielectric material that provides each first sacrificial material layer 18L may include, for example, a semiconductor oxide, semiconductor nitride or semiconductor oxynitride. In one example, each first sacrificial material layer 18L may include silicon dioxide. In such an embodiment, the silicon that provides each second sacrificial material layer 20L may be amorphous or polycrystalline.

In some embodiments, and when the bottommost first sacrificial material layer 18L of material stack 16 is composed of a semiconductor material, such as a silicon germanium alloy, the bottommost first sacrificial material layer 18L may represent a topmost semiconductor layer of a SOI substrate.

In some embodiments, and when semiconductor materials are employed as the first and second sacrificial material layers (18L, 20L), an epitaxial growth process may be used in forming at least a portion of the material stack. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Thus, and in some embodiments, each sacrificial material within the material stack has a same crystal orientation.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of each epitaxial semiconductor material layer can be performed utilizing any well known precursor gas or gas mixture including for example, a silicon containing precursor gas (such as silane) and/or a germanium containing precursor gas (such as a germane). Carrier gases like hydrogen, nitrogen, helium and argon can be used.

In some embodiments, the material stack 16 can be formed utilizing any known deposition process or combination of deposition processes. For example, chemical vapor deposition and/or plasma enhanced chemical vapor deposition may be used to provide material stack 16. In some embodiments, a wafer bonding process may be used to form at least a portion of the material stack 16 atop the substrate 10.

Each first sacrificial material layer 18L in the material stack 16 has a first thickness (i.e., first vertical height), while each second sacrificial material layer 20L in the stack has a second thickness (i.e., second vertical height), wherein the second thickness is less than the first thickness. In one embodiment of the present application, the first thickness of each first sacrificial material layer 18L can be in a range from 8 nm to 25 nm, while the second thickness of each second sacrificial material layer 20L can be in a range from 4 nm to 15 nm. Other first and second thicknesses that are lesser than, or greater than, the aforementioned ranges may also be employed in the present application.

Referring now to FIGS. 2A-2B, there are shown various views of the exemplary semiconductor structure of FIG. 1 after patterning the material stack 16 and releasing a portion of each second sacrificial material layer 20L by selectively removing a portion of each first sacrificial material layer 18L, in accordance with one embodiment of the present application. In the drawings, element 18P represents portions of each first sacrificial material layer 18L that remain after patterning and releasing a portion of each second sacrificial material layer 20L. Each remaining portion of the first sacrificial material layer 18L may be referred to herein as first sacrificial material anchor 18P. In the embodiment illustrated, a pair of anchoring elements, i.e., first sacrificial material anchor 18P, is present at the ends of each released second sacrificial material layer 20L.

The patterning of the material stack 16 may be performed by lithography and etching: FIG. 2B shows the patterning in more detail. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

The releasing a portion of each second sacrificial material layer 20L by selectively removing a portion of each first sacrificial material layer 18L comprises an etch that is selective for removing exposed portions of first sacrificial material layer 18L relative to the sacrificial material that provides each second sacrificial material layer 20L. In one example, and when each first sacrificial material layer 18L comprises a silicon germanium alloy, and each second sacrificial material layer 20L comprises silicon, an etch in HCl gas can be employed. In another example, and when each first sacrificial material layer 18L comprises silicon dioxide, and each second sacrificial material layer 20L comprises amorphous or polycrystalline silicon, an etch in aqueous hydrofluoric acid can be employed. As is shown in FIG. 2A (and also in FIG. 3A), the released portions of each released second sacrificial material layer 20L do not contact any portion the underlying first sacrificial material anchors 18P.

Referring now to FIGS. 3A-3B, there are shown various views of the exemplary semiconductor structure of FIG. 1 after patterning the material stack 16 and releasing a portion of each second sacrificial material layer 20L by selectively removing a portion of each first sacrificial material layer 18L, in accordance with another embodiment of the present application. In the embodiment illustrated, three anchoring elements, i.e., first sacrificial material anchors 18P, are present beneath each released second sacrificial material layer 20L.

Figure 4:
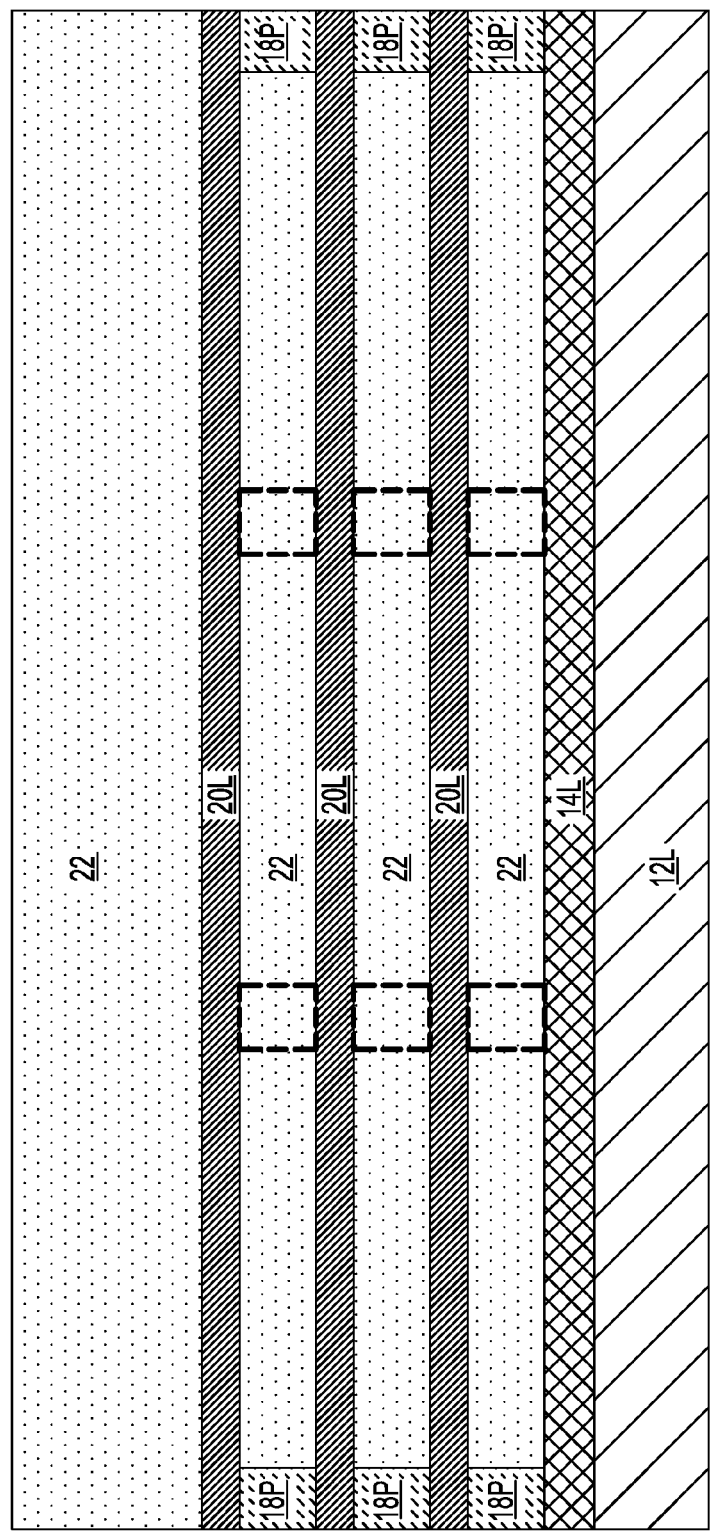
FIG. 4 is a cross sectional view of the exemplary semiconductor structure of FIG. 2A after forming a dielectric material above and beneath each second sacrificial material layer.
Figure 5:
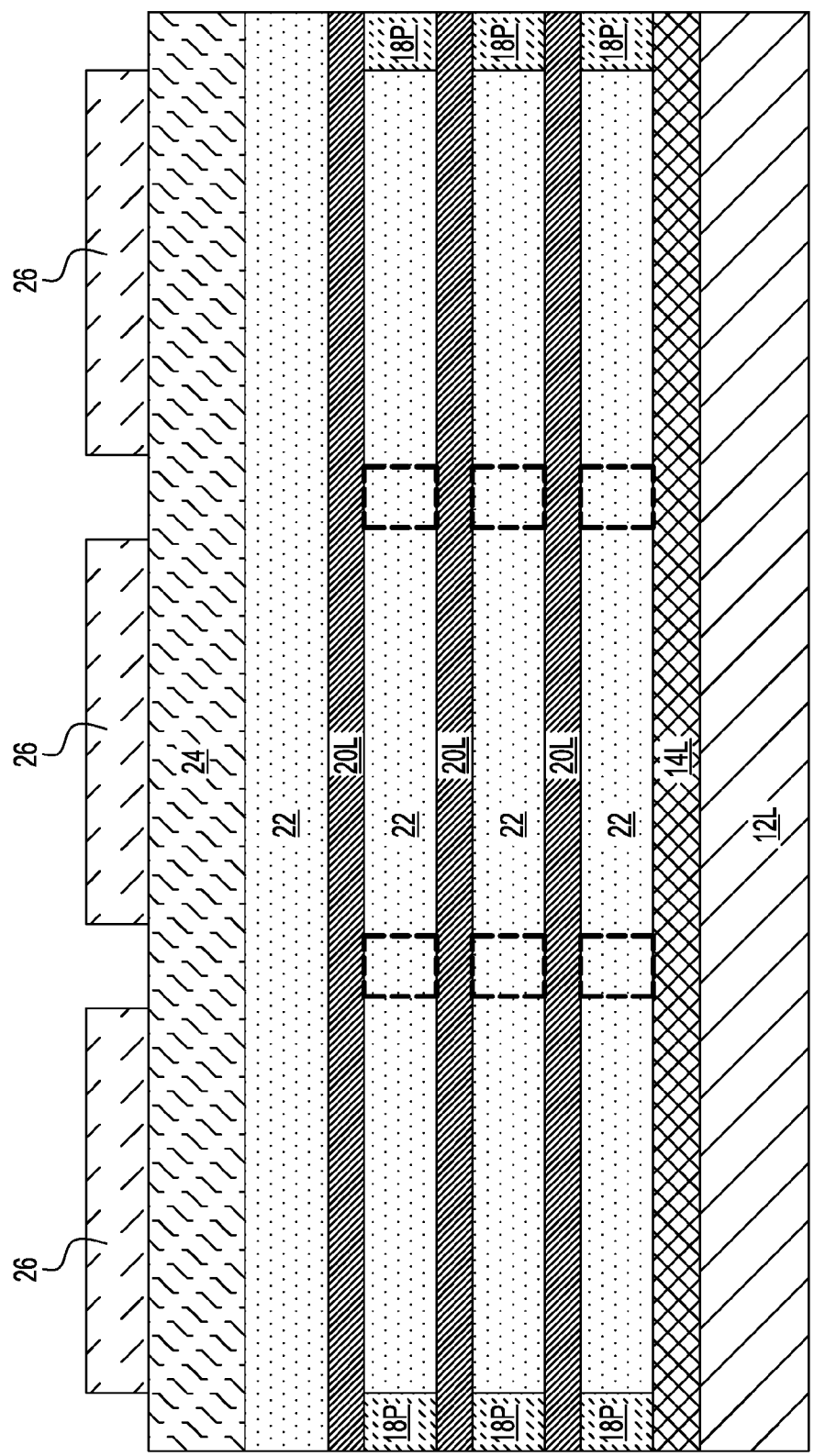
FIG. 5 is a cross sectional view of the exemplary semiconductor structure of FIG. 4 after forming a hard mask layer on a topmost surface of the dielectric material and a plurality of patterned first masks on the hard mask layer.

The patterning and selective removing employed in this embodiment of the present application are the same as described above in providing the exemplary semiconductor structure shown in FIGS. 2A-2B. Although the present application, illustrates an embodiment in which either a pair or three anchoring elements is provided beneath each released second sacrificial material layer 20L, the present application is not limited to only those number of anchoring elements being formed. In FIGS. 4-5, the dotted lines within the drawings represent the position of one of the anchoring elements.

In either embodiment shown in FIGS. 2A-B or 3A-3B, a hydrogen anneal may be employed to smooth the released portions of each released second sacrificial material layer 20L. The anneal can be performed at a temperature from 700° C. to 950° C. Smoothing of the released portions of each released second sacrificial material layer 20L may also be performed by performing a series of oxidation and etching steps.

Referring now to FIG. 4, there is illustrated the exemplary semiconductor structure of FIG. 2A after forming a dielectric material 22 above and beneath each second sacrificial material layer 20L. Although FIG. 2A is described and illustrated, the exemplary semiconductor structure shown in FIG. 3A or any corresponding structure including any other number of anchoring elements can be employed in the present application. The dielectric material 22 may comprise a dielectric oxide, dielectric nitride or dielectric oxynitride. For example, dielectric material 22 may comprise silicon dioxide, silicon nitride or silicon oxynitride. In some embodiments, the dielectric material 22 may comprise a same dielectric material as insulator layer 14L. In other embodiments, the dielectric material 22 may comprise a different dielectric material than insulator layer 12L. Dielectric material 22 however must be a different material than either the first or second sacrificial material layers 18L, 20L mentioned above.

In some embodiments and as shown, a bottommost surface of dielectric material 22 is in direct physical contact with a topmost surface of insulator layer 12L. In other embodiments (not shown), the bottommost surface of dielectric material 22 is in direct physical contact with a surface of a bulk semiconductor substrate.

Dielectric material 22 can be formed utilizing any deposition process including, for example, chemical vapor deposition or plasma chemical vapor deposition. A planarization process such as, for example, chemical mechanical planarization (CMP), may follow the deposition of the dielectric material 22.

As is shown in FIG. 4, a portion of the dielectric material 22 is located above the topmost surface of the topmost second sacrificial material layer 20L and a portion of the dielectric material 22 completely fills in the voids that are located beneath the released portions of each second sacrificial material layer 20L.

Referring now to FIG. 5, there is illustrated the exemplary semiconductor structure of FIG. 4 after forming a hard mask layer 24 on a topmost surface of the dielectric material 22 and a plurality of patterned first masks 26 on the hard mask layer 24.

Hard mask layer 24 comprises a dielectric hard mask material that has a composition that is different from the composition of dielectric material 22. In one embodiment, and when the dielectric material 22 comprises silicon dioxide, hard mask layer 24 may comprise silicon nitride. The hard mask layer 24 may be formed utilizing a deposition process such as, for example, chemical vapor deposition or plasma enhanced chemical vapor deposition. The hard mask layer 24 is a contiguous layer that covers the entirety of the dielectric material 22. The hard mask layer 24 can have a thickness from 10 nm to 100 nm. Other thickness that are lesser than, or greater than, the aforementioned thickness range may also be employed as the thickness of the hard mask layer 24.

Patterned first masks 26 are composed of one of the photoresist materials mentioned above and can be formed by depositing a photoresist material and then subjecting the deposited photoresist to lithography (as also described above).

Figure 6:
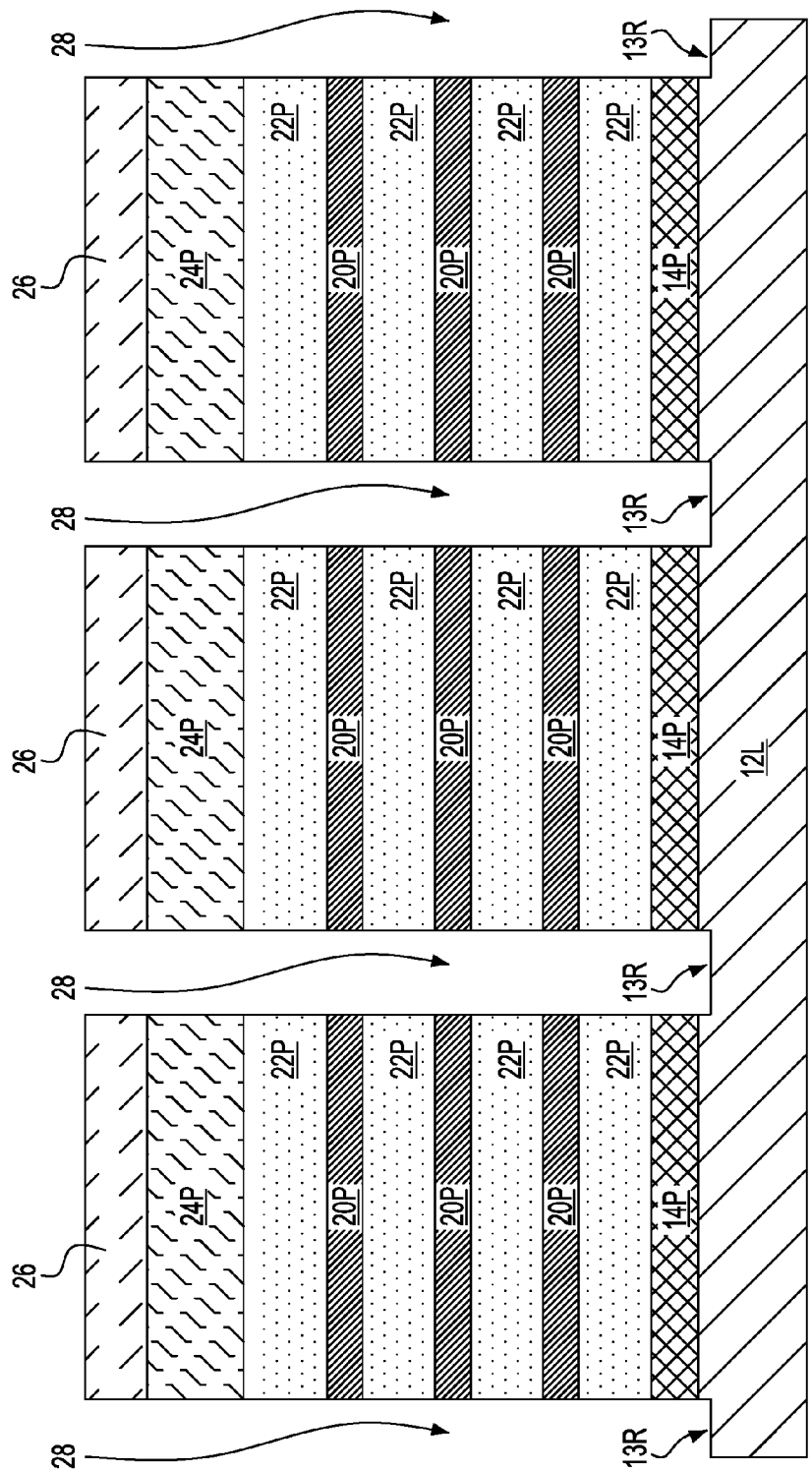
FIG. 6 is a cross sectional view of the exemplary semiconductor structure of FIG. 5 after performing an etch utilizing each patterned first mask as an etch mask to provide a plurality of patterned first structures.

Referring now to FIG. 6, there is illustrated the exemplary semiconductor structure of FIG. 5 after performing an etch utilizing each patterned first mask 26 as an etch mask to provide a plurality of patterned first structures separated by a first gap 28. The etch used to provide the plurality of patterned first structures separated by the first gap 28 comprises an anisotropic etch such as, for example, reactive ion etching. As is shown, etching is performed in areas on which the first sacrificial material anchors 18P are present. Thus, the etch completely removes each first sacrificial material anchor 18P from the structure.

The etch employed in the present application stops on a semiconductor surface of the underlying substrate. In the illustrated, the etch stops on a recessed surface 13R of handle substrate 12L. By "recessed surface" it is meant a sub-surface of a material layer that is located between a topmost surface of the material layer and a bottommost surface of the material layer.

In the embodiment illustrated in the drawings, each first patterned structure that is formed includes a remaining portion of the insulator layer 14L (hereinafter referred to as insulator portions 14P), remaining portions of the dielectric material 22 (hereinafter referred to as dielectric material portions 22P), remaining portions of the second sacrificial material layer 20L (hereinafter referred to second sacrificial material portions 20P), and remaining portions of the hard mask layer 24 (hereinafter referred to as hard mask portions 24P). As is shown, the outermost sidewall surfaces of each patterned first structure (14P, 22P, 20P, 24P) are vertically aligned with each other. Thus, and after etching, the width of each component that constitutes the patterned first structure (14P, 22P, 20P, 24P) is the same. In one embodiment, the width of each component that constitutes the patterned first structure (14P, 22P, 20P, 24P) can be from 100 nm to 300 nm. As mentioned above, each patterned first structure (14P, 22P, 20P, 24P) that is formed is separated by a first gap 28. The first gap 28 has a first width which can be from 50 nm to 500 nm.

Figure 7:
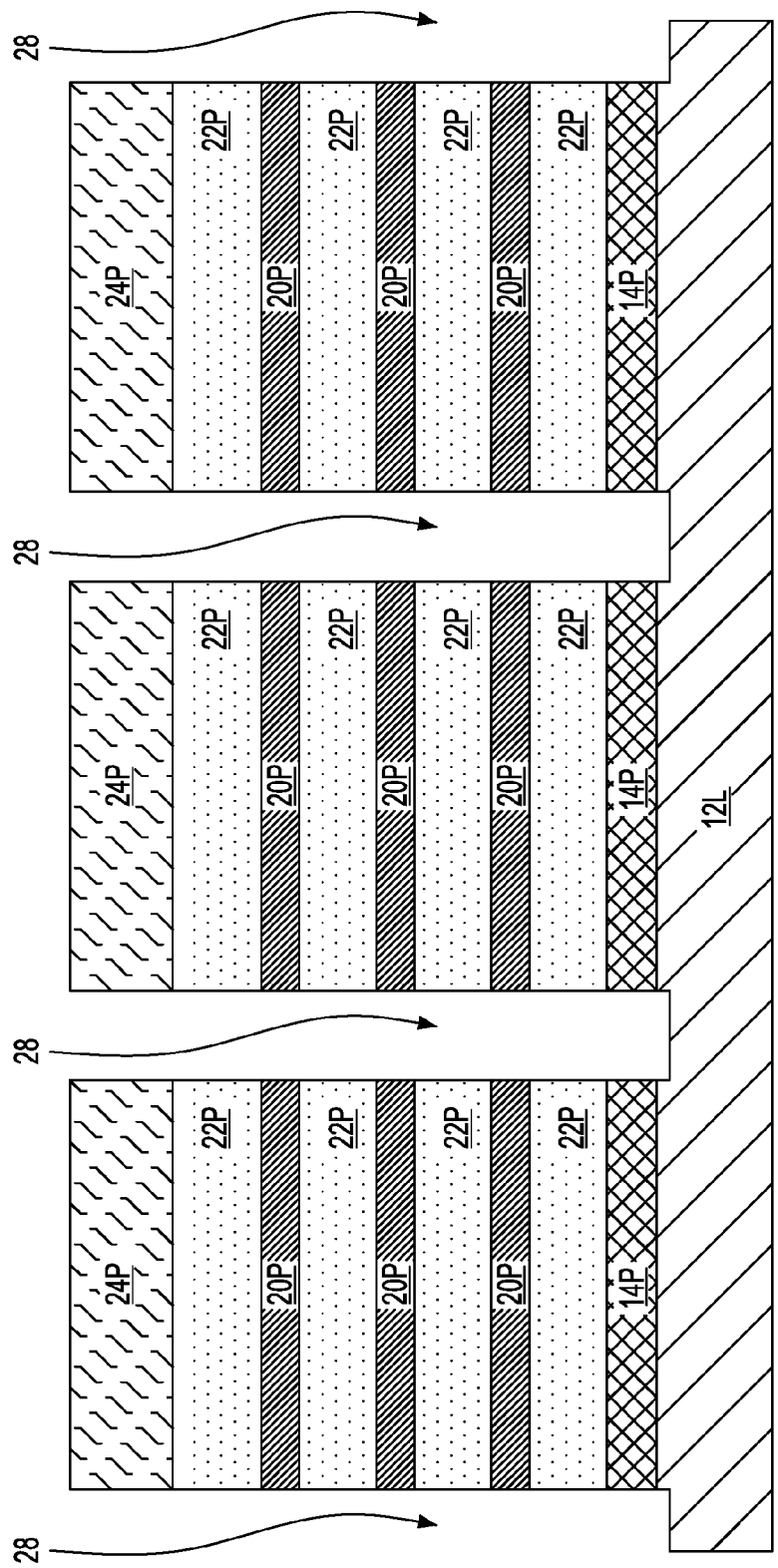
FIG. 7 is a cross sectional view of the exemplary semiconductor structure of FIG. 6 after removing each patterned first mask.

Referring now to FIG. 7, there is illustrated the exemplary semiconductor structure of FIG. 6 after removing each patterned first mask 26. Each patterned first mask 26 can be removed utilizing a conventional resist stripping process such as, for example, ashing. After removing each patterned first mask 26, the topmost surface of each hard mask portion 24P is exposed.

Figure 8:
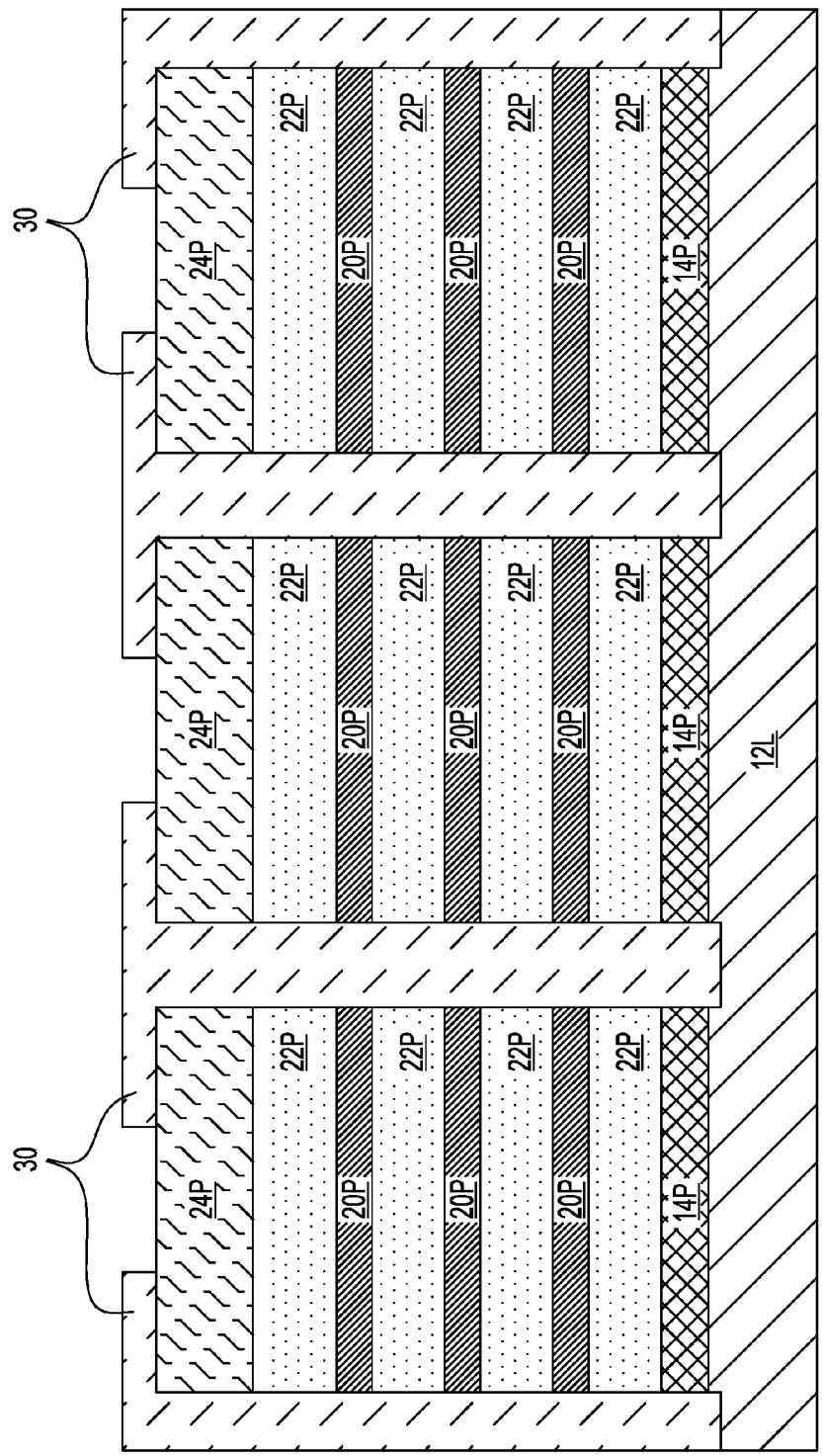
FIG. 8 is a cross sectional view of the exemplary semiconductor structure of FIG. 7 after forming a plurality of patterned second masks, wherein a portion of each patterned second mask fills a gap located between each patterned first structure.

Referring now to FIG. 8, there is illustrated the exemplary semiconductor structure of FIG. 7 after forming a plurality of patterned second masks 30, wherein a portion of each patterned second mask 30 completely fills each first gap 28 that is located between each patterned first structure. The plurality of patterned second masks 30 are composed of one of the photoresist materials mentioned above and can be formed by depositing a photoresist material and then subjecting the deposited photoresist to lithography (as also described above). As is shown, the patterned second masks have a portion that completely fills one of the first gaps 28, and another portion that is present on a portion of the topmost surface of the hard mask portion 24P.

Figure 9:
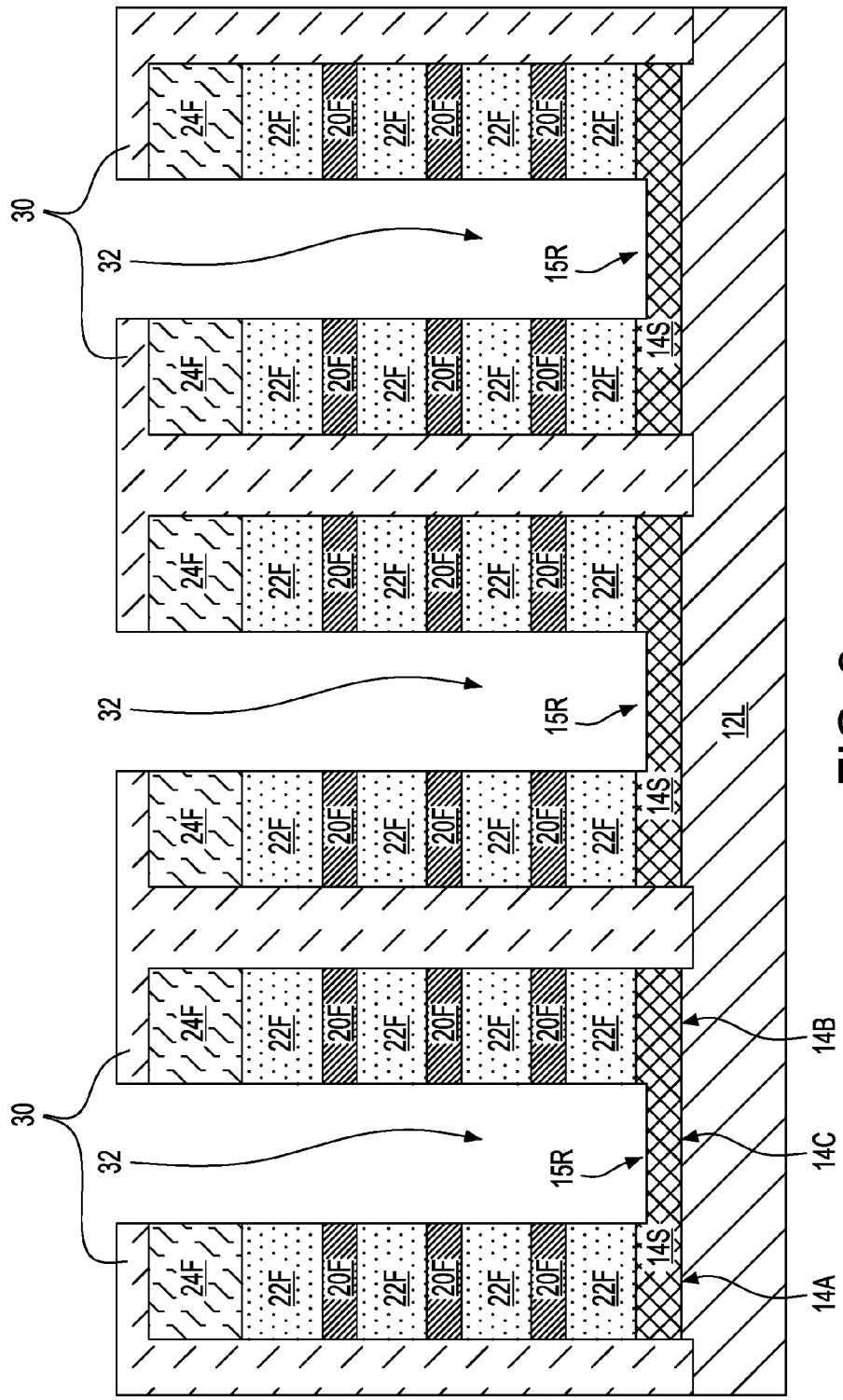
FIG. 9 is a cross sectional view of the exemplary semiconductor structure of FIG. 8 after performing an etch utilizing each patterned second mask as an etch mask to provide a plurality of patterned second structures.

Referring now to FIG. 9, there is illustrated the exemplary semiconductor structure of FIG. 8 after performing an etch utilizing each patterned second mask 30 as an etch mask to provide a plurality of patterned second structures. Each of the patterned second structures is separated by a second gap 32 having a second width that is greater than the first width of each first gap 28.

The etch used to provide the plurality of patterned second structures separated by the second gap 32 comprises an anisotropic etch such as, for example, reactive ion etching. As is shown, etching is performed through portions of each first patterned structure (14P, 22P, 20P and 24P).

The etch employed at this step of the present application stops on a dielectric material surface. In the illustrated, the etch stops on a recessed surface 15R of the insulator layer 14L. The insulator layer having the recessed surface 15R can be referred to herein as an insulator structure 14S. As is shown, each insulator structure 14S has two end portions (first and second end portions labeled as 14A, 14B, respectively) having a non-recessed surface and a middle portion (labeled as 14C) that has the recessed surface 15R. In some embodiments and when a bulk semiconductor substrate is employed, the etch stops within a bottommost dielectric material portion 22P and also forms the insulator structure mentioned above.

After etching, a plurality of patterned second structures is formed. In the embodiment illustrated in the drawings, each patterned second structure that is formed includes a remaining portion of the insulator portion 14P (hereinafter referred to as insulator structure 14S), remaining portions of the dielectric material portions 22P (hereinafter referred to as dielectric material nanowire portions 22F), remaining portions of the second sacrificial material portion 20P (hereinafter referred to as second sacrificial material nanowire portions 20F), and remaining portions of the hard mask portion 24P (hereinafter referred to as hard mask nanowire portions 24F). As is shown, the outermost sidewall surfaces of the dielectric material nanowire portions 22F, the second sacrificial material nanowire portions 20F, and hard mask nanowire portions 24F are vertically aligned with each other, and are present on an end portion of the insulator structure 14S having the non-recessed surface.

Thus, and after etching, the width of the dielectric material nanowire portions 22F, the second sacrificial material nanowire portions 20F, the hard mask nanowire portions 24F, the end portion of the insulator structure 14S having the non-recessed surface is the same. In one embodiment, the width of the dielectric material nanowire portions 22F, the second sacrificial material nanowire portions 20F, the hard mask nanowire portions 24F, the end portion of the insulator structure 14S can be from 20 nm to 50 nm. As mentioned above, each patterned second structure that is formed is separated by the first gap 32 having the second width. The second width of each second gap 32 can be from 80 nm to 250 nm.

Figure 10:
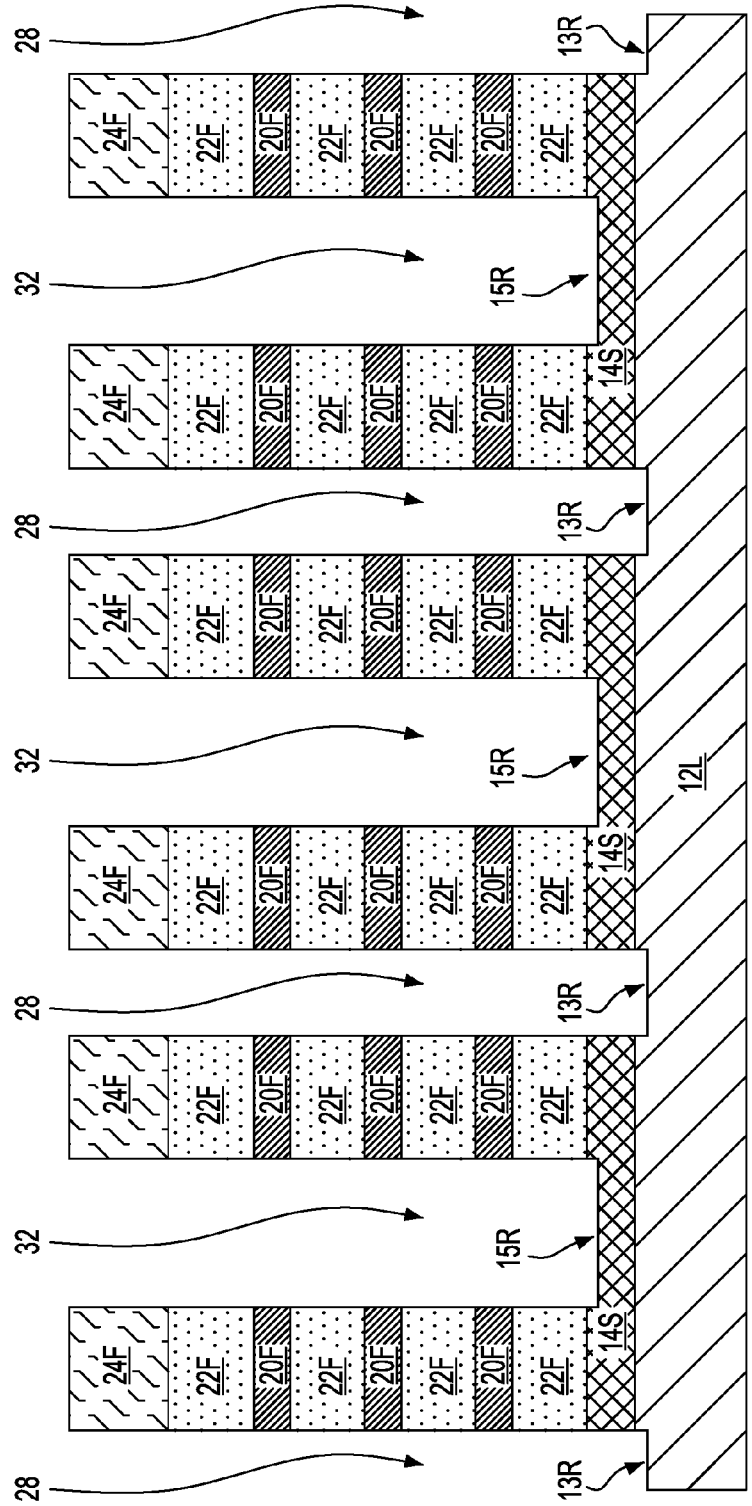
FIG. 10 is a cross sectional view of the exemplary semiconductor structure of FIG. 9 after removing each patterned second mask.

Referring now to FIG. 10, there is illustrated the exemplary semiconductor structure of FIG. 9 after removing each patterned second mask 30. Each patterned second mask 30 can be removed utilizing a conventional resist stripping process such as, for example, ashing. After removing each patterned second mask 30, the topmost surface of each hard mask nanowire portion 24F and each recessed semiconductor material surface 13R of the handle substrate 12L are exposed.

Figure 11:
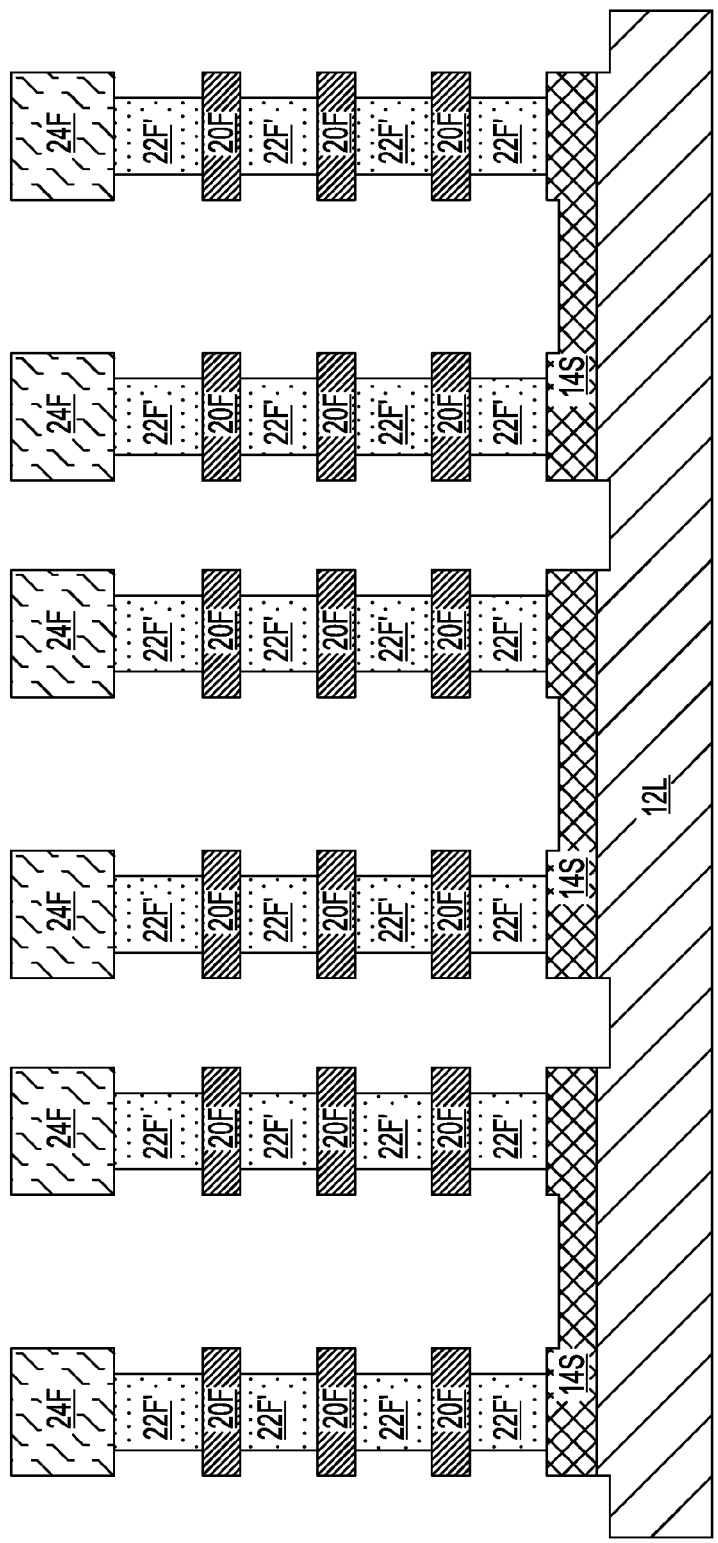
FIG. 11 is a cross sectional view of the exemplary semiconductor structure of FIG. 10 after recessing a portion of each remaining portion of dielectric material.

Referring now to FIG. 11, there is illustrated the exemplary semiconductor structure of FIG. 10 after recessing a portion of each remaining portion of dielectric material 22 (i.e., each dielectric material nanowire portion 22F). The remaining portions of each dielectric material nanowire portion 22F can be referred to herein as a dielectric material nanowire pillar portion 22F'. Each dielectric material nanowire pillar portion 22F' that is formed has a width that is less than a width of each second sacrificial material nanowire portion 20F.

Each dielectric material nanowire pillar portion 22F' can be formed utilizing a lateral etch that is selective in removing the dielectric material that provides dielectric material 22 relative to the second sacrificial material nanowire portions 20F, and the hard mask material nanowire portions 24F. In some embodiments, and when the dielectric material 22 comprises a different material than the insulator layer 12L no lateral etch of the insulator structure 14S occurs.

Figure 12:
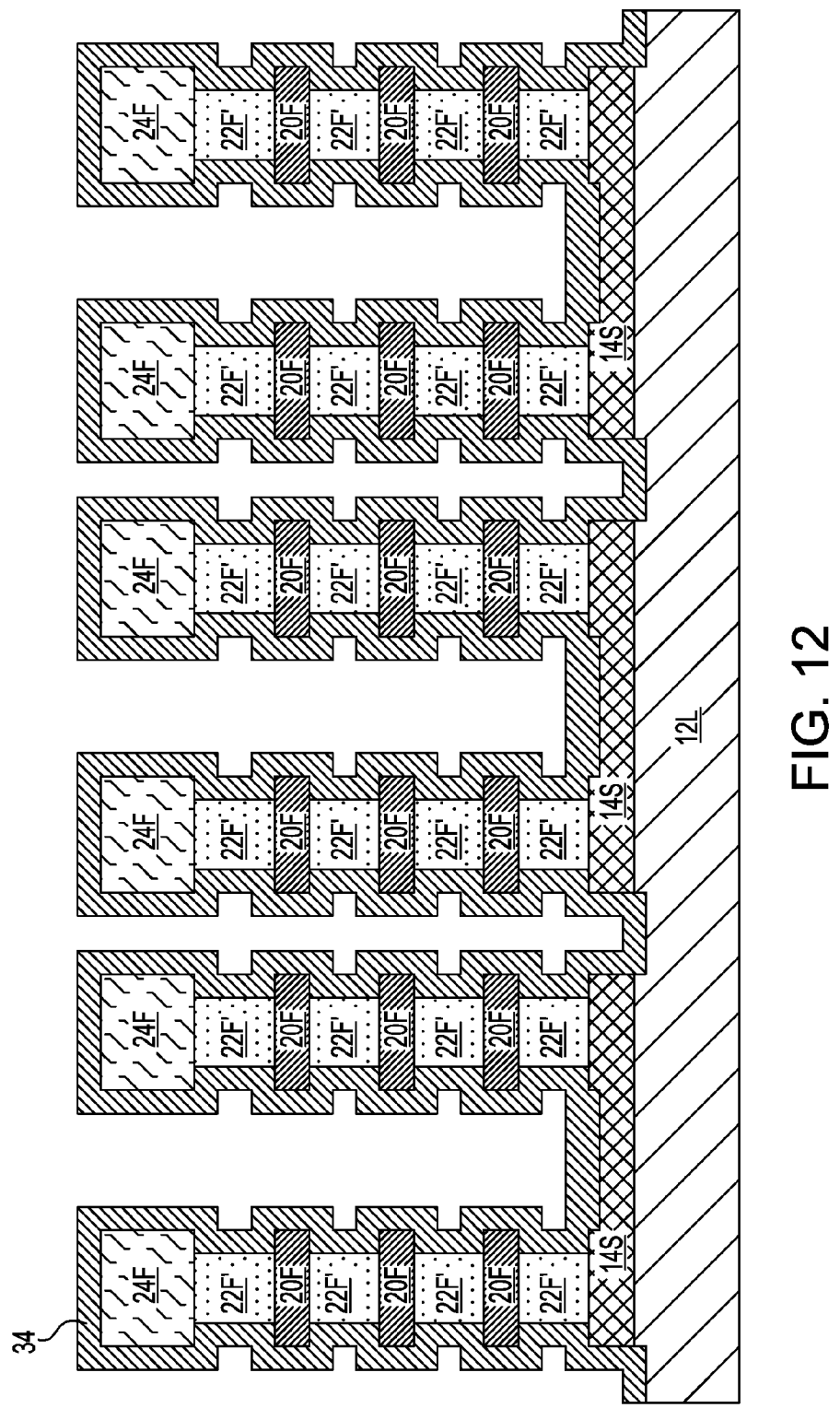
FIG. 12 is a cross sectional view of the exemplary semiconductor structure of FIG. 11 after forming a dielectric spacer material.

Referring now to FIG. 12, there is illustrated the exemplary semiconductor structure of FIG. 11 after forming a dielectric spacer material 34. Dielectric spacer material 34 is formed on the exposed surface of each patterned second structure including the dielectric material nanowire pillar portion 22F' as well as the exposed surfaces of the handle substrate 12L and the insulator structure 14S. The dielectric spacer material 34 is composed of a dielectric material that is different from that of the dielectric material 22 that provides each dielectric material nanowire pillar portion 22F' and that of insulator layer 14L that provides each insulator structure 14S. In some embodiments of the present application, the dielectric spacer material 34 may include a dielectric oxide, nitride and/or oxynitride. In one example, the dielectric spacer material 34 may comprise silicon nitride. In another embodiment of the present application, the dielectric spacer material may be composed of a low-k dielectric material. By "low-k" it is meant a dielectric material that has a dielectric constant of less than 4.0. The dielectric spacer material 34 is a conformal layer and it can be formed utilizing a deposition process such as, for example, chemical vapor deposition or plasma enhanced chemical vapor deposition.

Figure 13:
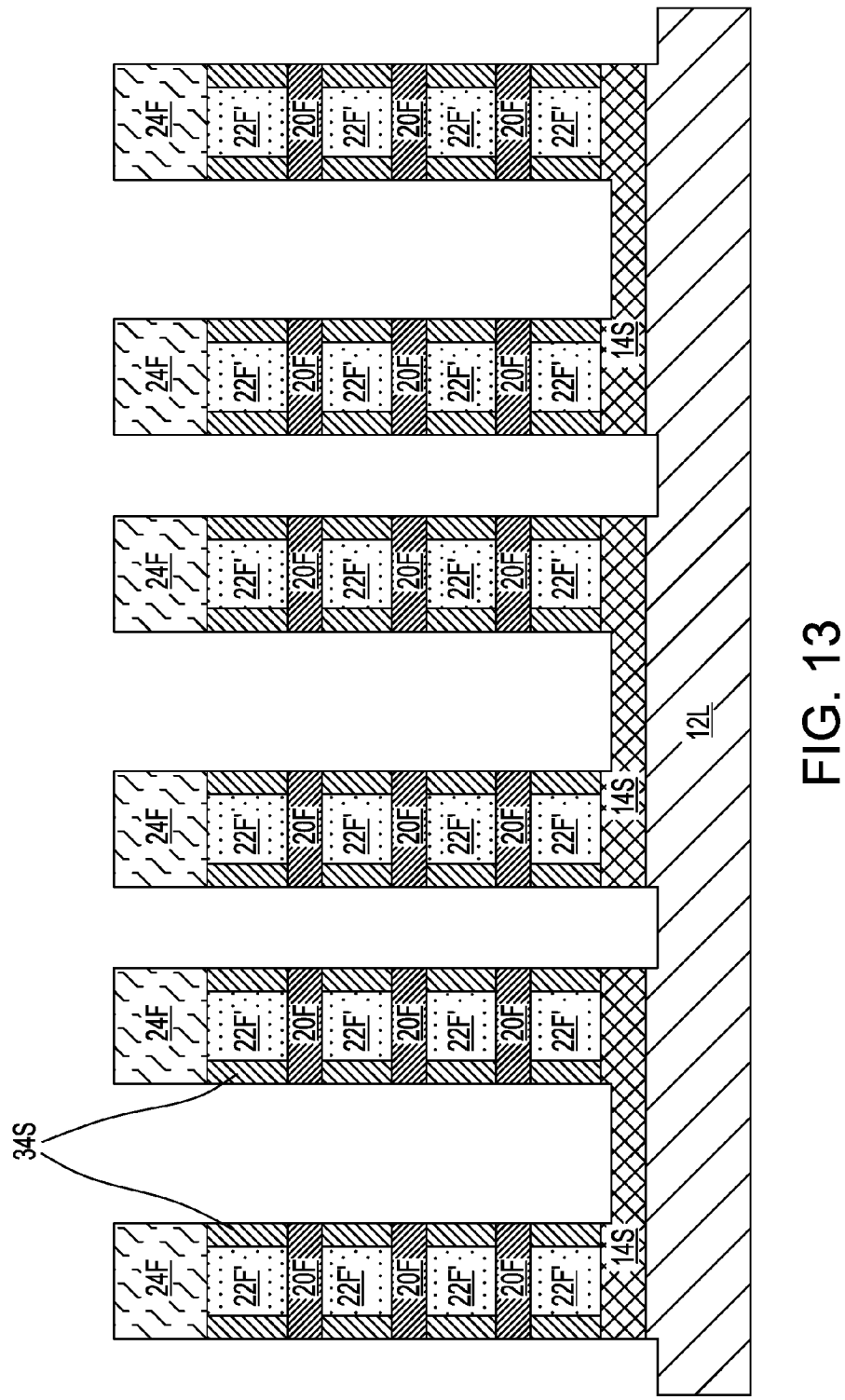
FIG. 13 is a cross sectional view of the exemplary semiconductor structure of FIG. 12 after etching the dielectric spacer material.

Referring now to FIG. 13, there is illustrated the exemplary semiconductor structure of FIG. 12 after etching the dielectric spacer material 34 to provide a dielectric spacer 34S. The etching of the dielectric spacer material 34 can be performed utilizing an anisotropic etch such as, for example, reactive ion etching. Each dielectric spacer 34S has an outermost sidewall that is vertically aligned with the outermost surface of each second sacrificial material nanowire portion 20F; and the innermost sidewall of each dielectric spacer 34S directly contacts a sidewall of one of the dielectric material nanowire pillar portions 22F'.

Figure 14:
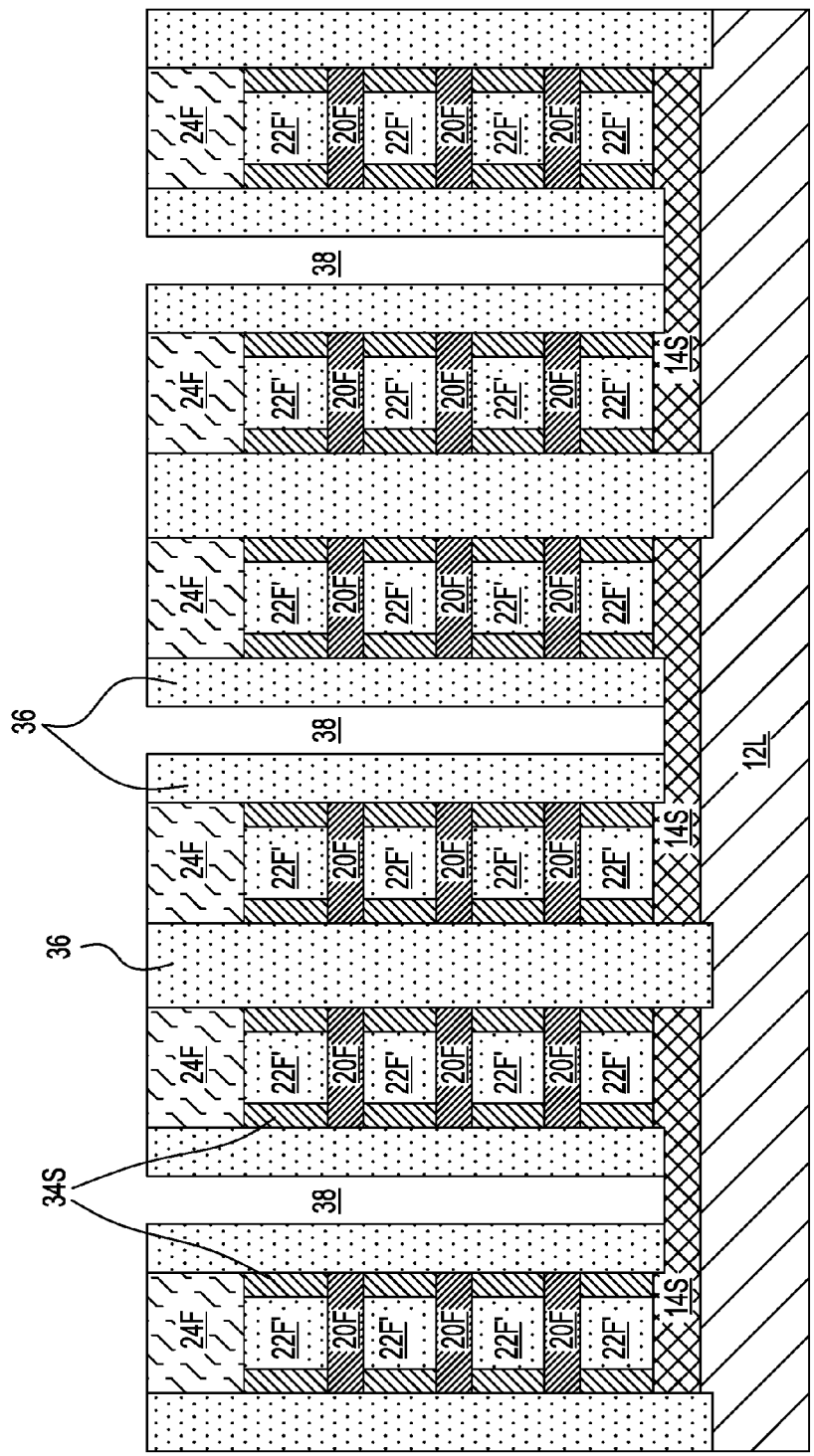
FIG. 14 is a cross sectional view of the exemplary semiconductor structure of FIG. 13 after forming a sacrificial dielectric material.

Referring now to FIG. 14, there is illustrated the exemplary semiconductor structure of FIG. 13 after forming a sacrificial dielectric material 36. As is shown, the sacrificial dielectric material 36 completely fills each first gap 28, while only partially filling each second gap 32. Within the second gap 32 a third gap 38 remains. The sacrificial dielectric material 36 may comprise any dielectric material including, for example, an oxide such as silicon dioxide. The sacrificial dielectric material 36 may be formed utilizing a deposition process such as chemical vapor deposition. An etching process and/or a planarization process may follow the deposition of the dielectric material that provides sacrificial dielectric material 36. It is noted that third gap 38 remains above the middle portion (14C) of each insulator structure 14S.

Figure 15:
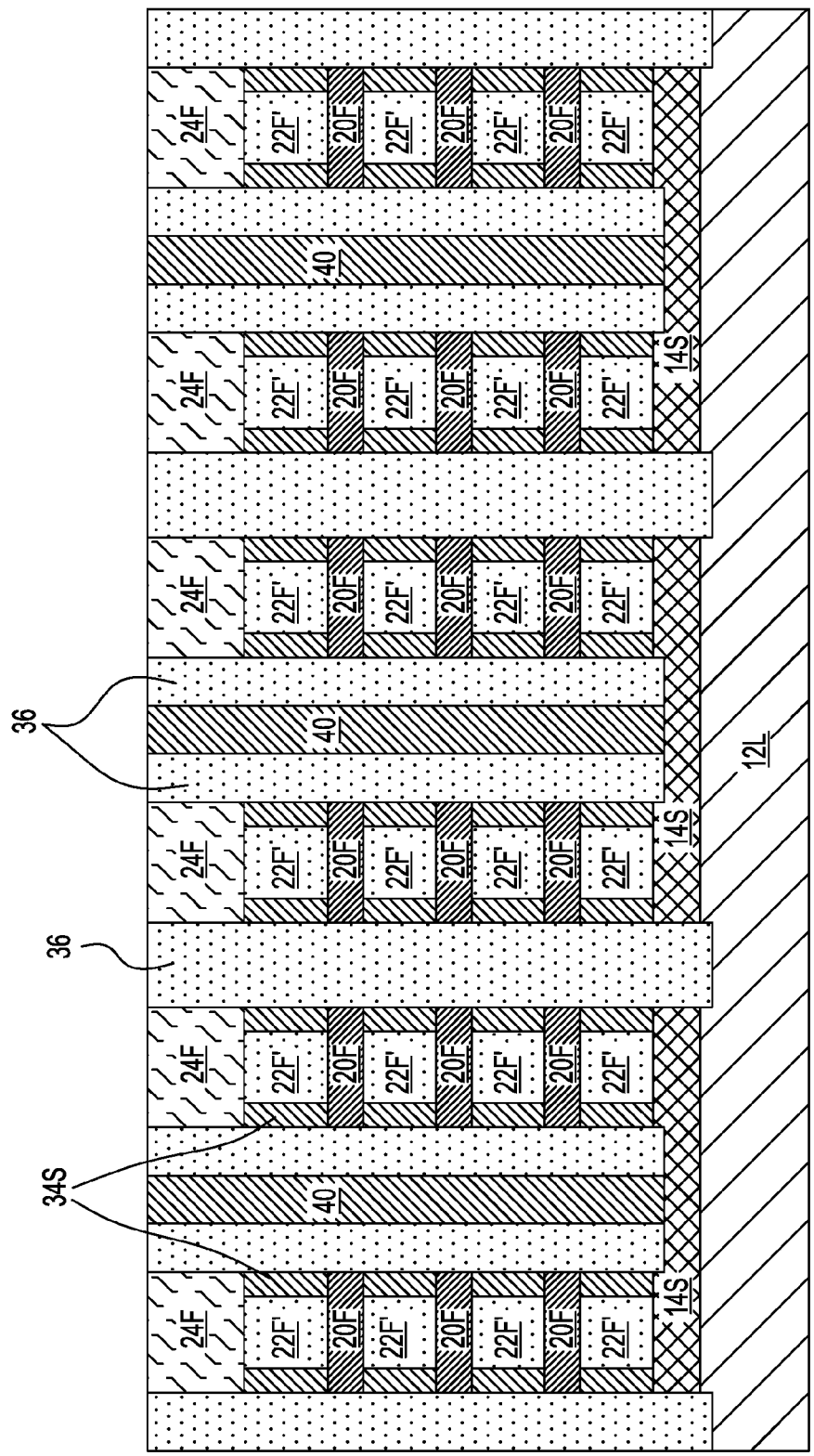
FIG. 15 is a cross sectional view of the exemplary semiconductor structure of FIG. 14 after forming a barrier material.

Referring now to FIG. 15, there is illustrated the exemplary semiconductor structure of FIG. 14 after forming a barrier material 40 within the third gap 38. Barrier material 40 extends upward from the exposed recessed surface of the middle portion 14C of each insulator structure 14S. Barrier material 40 may include a nitride such as, for example, a dielectric nitride (e.g., silicon nitride), or a metal nitride (e.g., titanium nitride or tantalum nitride). The battier material 40 may be formed utilizing a deposition process such as, for example, chemical vapor deposition, plasma enhanced chemical vapor deposition, sputtering or plating. A planarization process may follow the deposition process.

Figure 16:
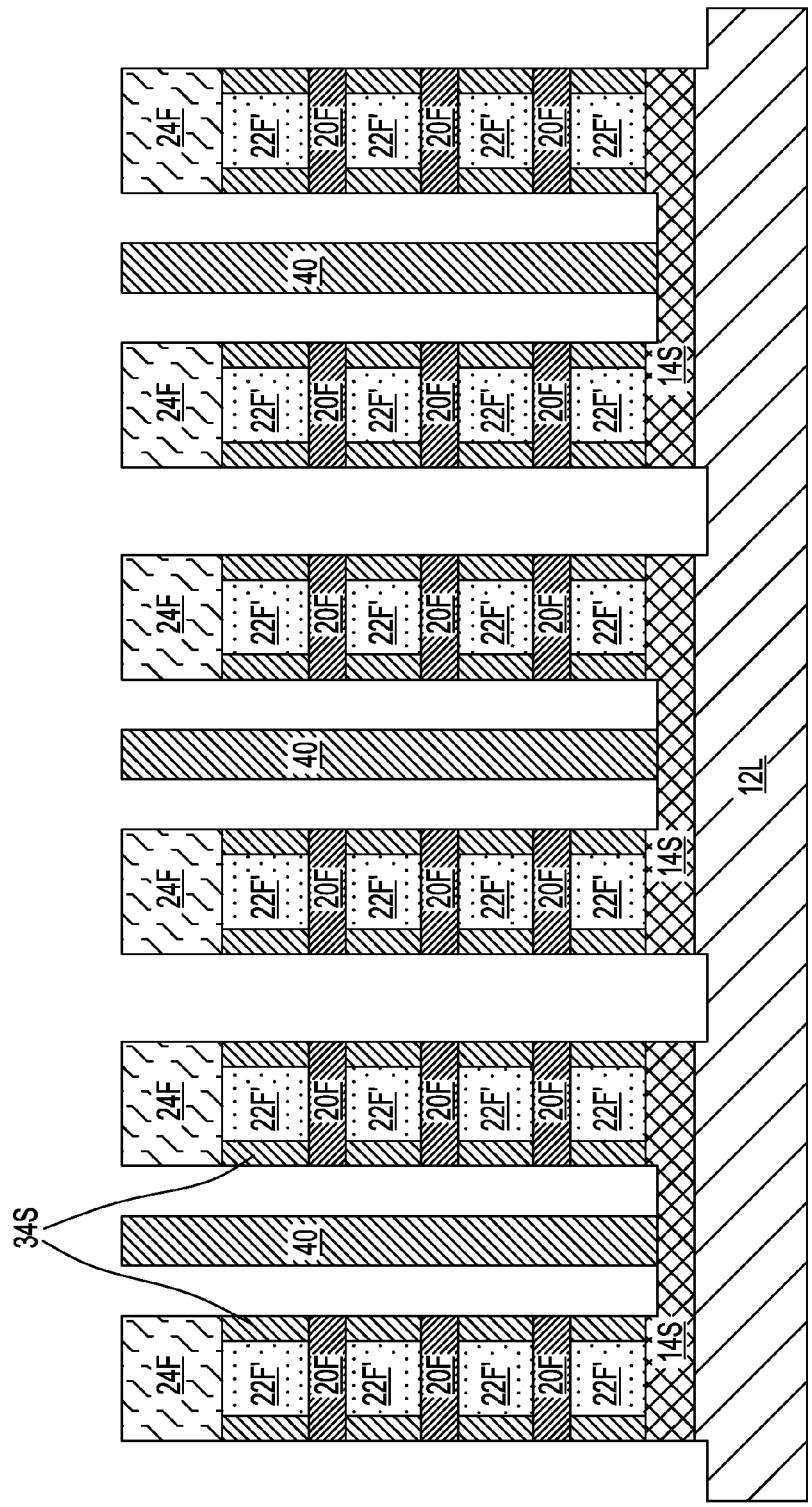
FIG. 16 is a cross sectional view of the exemplary semiconductor structure of FIG. 15 after removing the sacrificial dielectric material.

Referring now to FIG. 16, there is illustrated the exemplary semiconductor structure of FIG. 15 after removing the sacrificial dielectric material 36. The sacrificial dielectric material 36 can be removed utilizing an etching process that selectively removes the dielectric material that provides the sacrificial dialectic material 36. For example, and when the sacrificial dielectric material 36 is silicon dioxide, an aqueous hydrofluoric acid etch can be used to remove the sacrificial dielectric material 36 completely from the structure.

Figure 17:
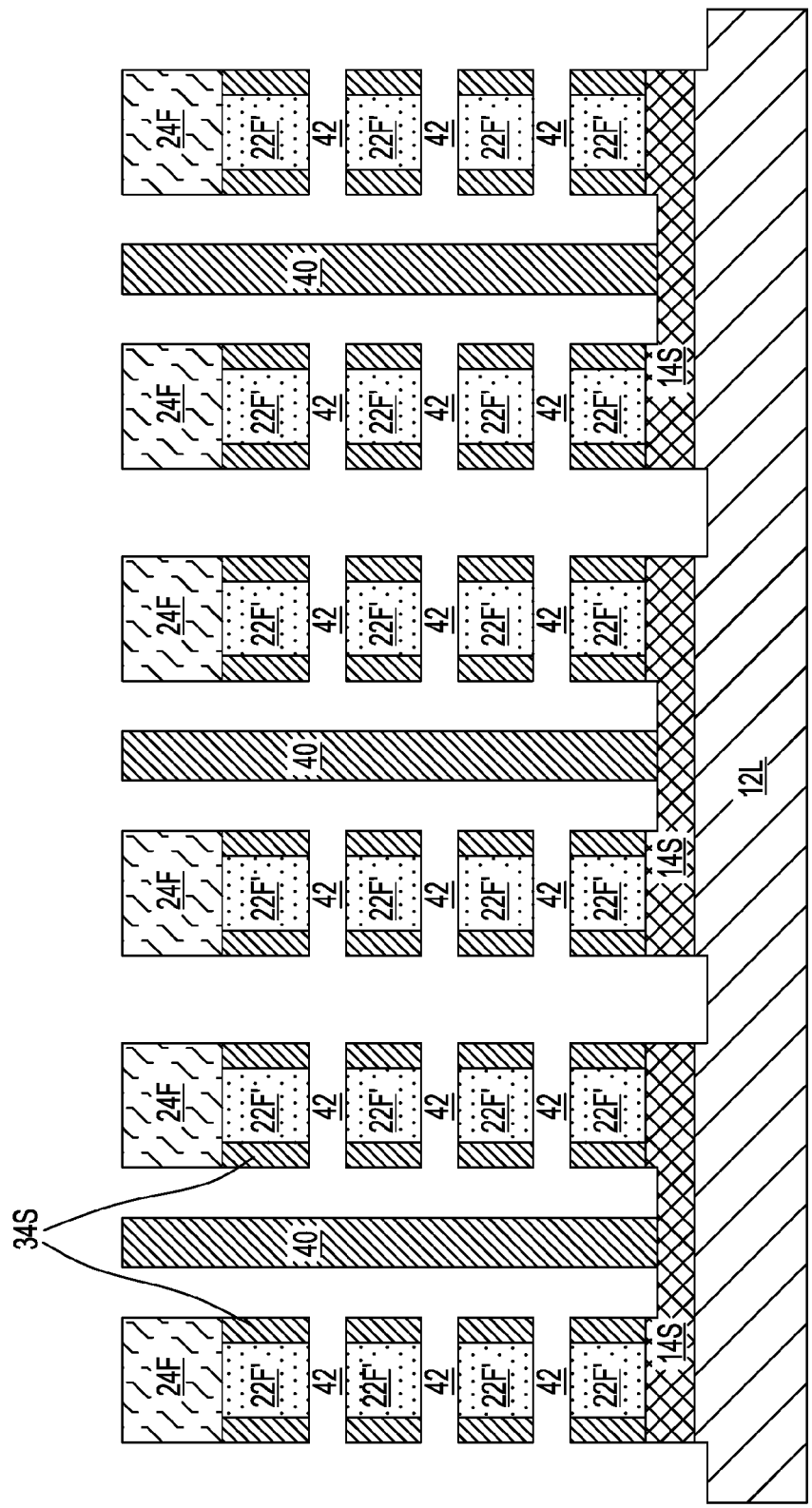
FIG. 17 is a cross sectional view of the exemplary semiconductor structure of FIG. 16 after removing each remaining portion of the second sacrificial material.

Referring now to FIG. 17, there is illustrated the exemplary semiconductor structure of FIG. 16 after removing each remaining portion of the second sacrificial material (i.e., second sacrificial material nanowire portions 20F). A void gap 42 is formed. The void 42 comprises the volume of the second sacrificial material nanowire portion 20F that was removed from the structure. Each second sacrificial material nanowire portion 20F can be removed utilizing an etch that is selective for removing the material of each second sacrificial material nanowire portion 20F. In one example, and when each second sacrificial material nanowire portion 20F comprises crystalline Si, TMAH (tetramethylammonium hydroxide) can be used as an etchant to selectively remove each second sacrificial material nanowire portion 20F. In another example, and when each second sacrificial material nanowire portion 20F comprises amorphous or polycrystalline Si, TMAH can be used as an etchant to selectively remove each second sacrificial material nanowire portion 20F.

Figure 18:
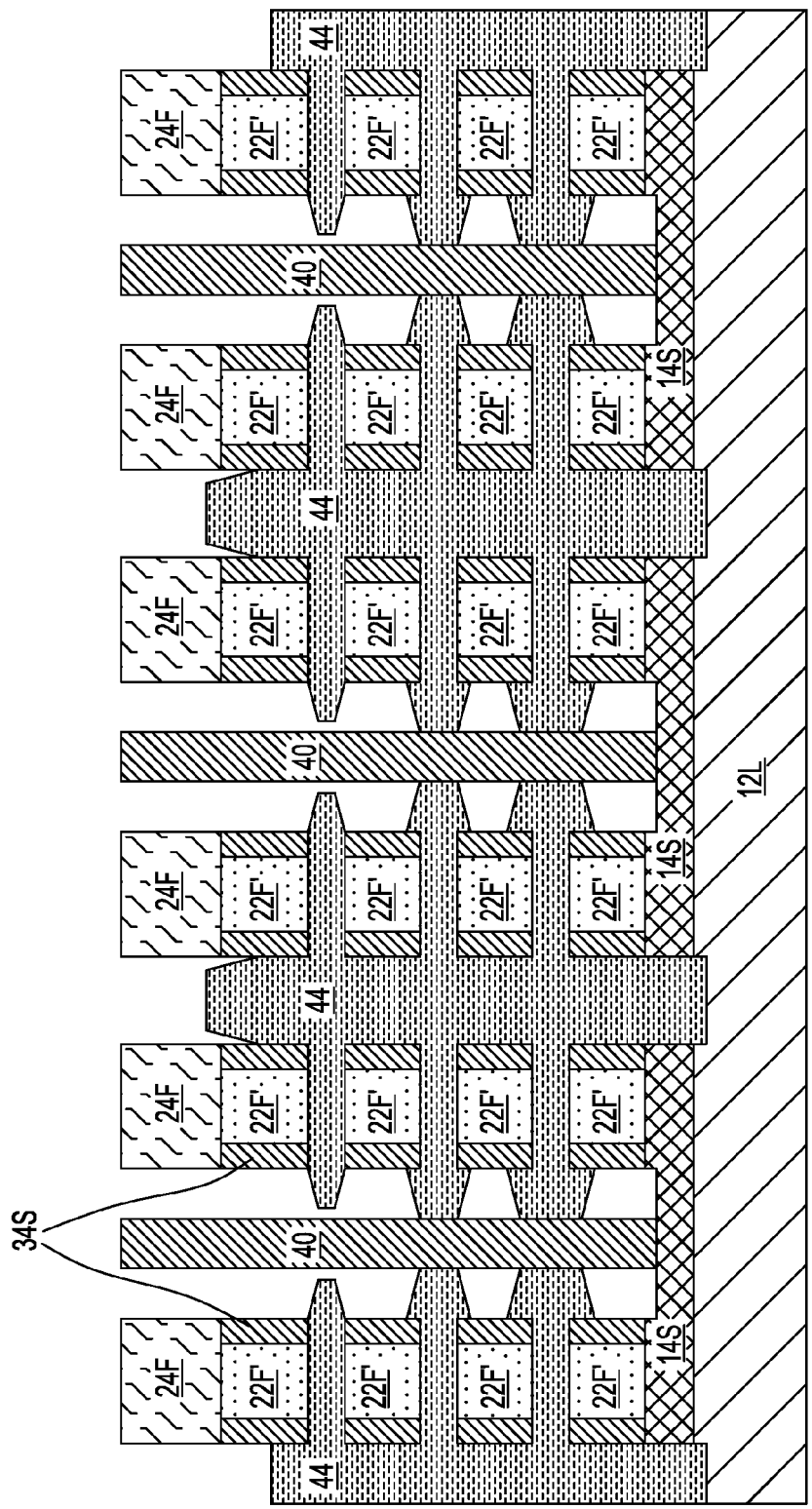
FIG. 18 is a cross sectional view of the exemplary semiconductor structure of FIG. 17 after epitaxially growing a III-V compound semiconductor or germanium layer.

Referring now to FIG. 18, there is illustrated the exemplary semiconductor structure of FIG. 17 after epitaxially growing a III-V compound semiconductor or germanium layer 44. The III-V compound semiconductor or germanium layer 44 is grown bottom-up from the exposed semiconductor surface of the substrate, e.g., the recessed surface 13R of the handle substrate portion 12L. As is shown, the III-V compound semiconductor or germanium layer 44 completely fills each void 42. In one embodiment, a III-V compound semiconductor is grown as layer 44. In another embodiment, germanium is grown as layer 44. The epitaxial growth of the III-V compound semiconductor or germanium layer 44 is a bottom-up process in which the exposed semiconductor surfaces (i.e., recessed surfaces 13R) are used as an epitaxial seed (or growth) layer. The III-V compound semiconductor or germanium layer 44 thus has an epitaxial relationship with the growth surface mentioned above. The epitaxial growth of the III-V compound semiconductor or germanium layer 44 can be performed as described above utilizing any well known III-V compound semiconductor or germanium precursor(s) well known to those skilled in the art.

Figure 19:
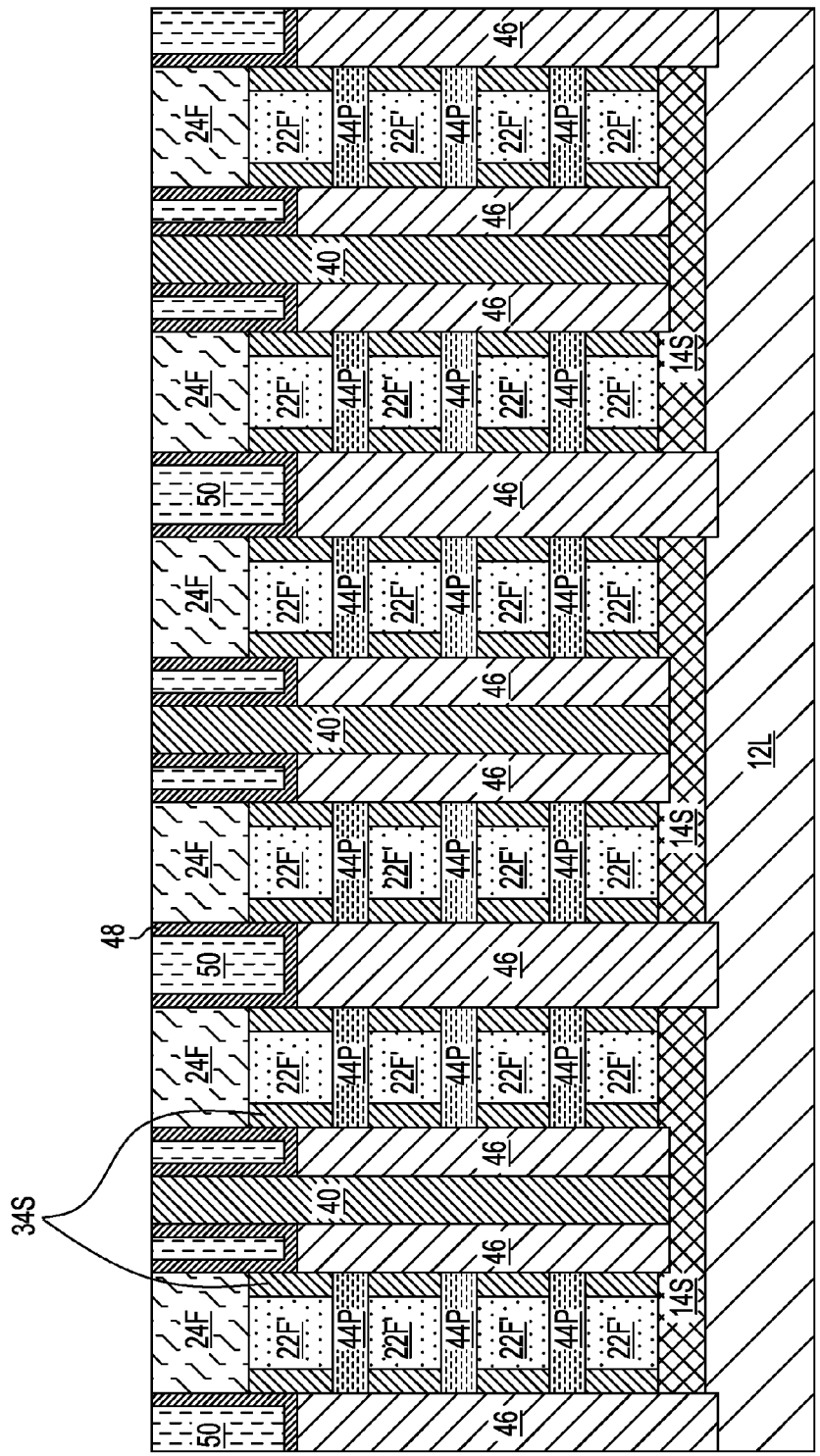
FIG. 19 is a cross sectional view of the exemplary semiconductor structure of FIG. 18 after removing portions of the epitaxially grown III-V compound semiconductor or germanium layer, forming a source/drain semiconductor material structure from exposed end portions of the remaining epitaxially grown III-V compound semiconductor or germanium layer, and forming a middle-of-the-line (MOL) dielectric material.

Referring now to FIG. 19, there is illustrated the exemplary semiconductor structure of FIG. 18 after removing portions of the epitaxially grown III-V compound semiconductor or germanium layer 44, forming a source/drain semiconductor material structure 46 from exposed end portions of the remaining epitaxially grown III-V compound semiconductor or germanium layer (i.e., III-V or germanium semiconductor nanowires 44P), and forming a middle-of-the-line (MOL) dielectric material 50.

The portions of the epitaxially grown III-V compound semiconductor or germanium layer 44 that are removed are exposed and at located outside void 42. The removal of the exposed portions of the epitaxially grown III-V compound semiconductor or germanium layer 44 may be performed utilizing an anisotropic etching process such as, for example, reactive ion etching. The remaining portions of the epitaxially grown III-V compound semiconductor or germanium layer 44 that are located within void 42 may be referred to herein as III-V or germanium semiconductor nanowires 44P. As shown, the III-V or germanium semiconductor nanowires 44P are stacked one atop the other. As is further shown, the outermost sidewalls of each III-V or germanium semiconductor nanowire 44P is vertically aligned with the outermost sidewalls of the dielectric spacer 34S.

Next, the source/drain semiconductor material structures 46 are epitaxially grown from exposed end portions of the III-V or germanium semiconductor nanowire 44P. At least one of the source/drain semiconductor material structure 46 has a bottommost surface that directly contacts a semiconductor surface (i.e., the recess surface 13R) of handle substrate 12L.

Each source/drain semiconductor material structure 46 includes a semiconductor material and a dopant. The semiconductor material may include one of the semiconductor materials mentioned above for handle substrate 12L. In one embodiment, each source/drain semiconductor material structures 46 may comprise silicon or a silicon germanium alloy.

The dopant that is present in each source/drain semiconductor material structure 46 may be a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the each source/drain semiconductor material structure 46 can be introduced into the precursor gas that provides each source/drain semiconductor material structure 46. In another embodiment, the dopant can be introduced into an intrinsic semiconductor layer by utilizing one of ion implantation or gas phase doping. Each source/drain semiconductor material structure 46 may be formed utilizing an epitaxial growth process as mentioned above utilizing well known precursors.

Next, a barrier liner 48 such as a metal nitride can be formed atop each source/drain semiconductor material structure 46 and along the sidewalls of each hard mask material fin portion 24F. The barrier liner 48 may be formed utilizing a deposition process such as, for example, chemical vapor deposition or plasma enhanced chemical vapor deposition. At this point of the present application, a MOL dielectric material 50 is formed which has a topmost surface that is coplanar with a topmost surface of each hard mask material nanowire portion 24F. MOL dielectric material 50 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as MOL dielectric material 50. The use of a self-planarizing dielectric material as the MOL dielectric material 50 may avoid the need to perform a subsequent planarizing step.

In one embodiment, the MOL dielectric material 50 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the MOL dielectric material 50, a planarization process or an etch back process follows the deposition of the dielectric material that provides the MOL dielectric material 50.

Figure 20:
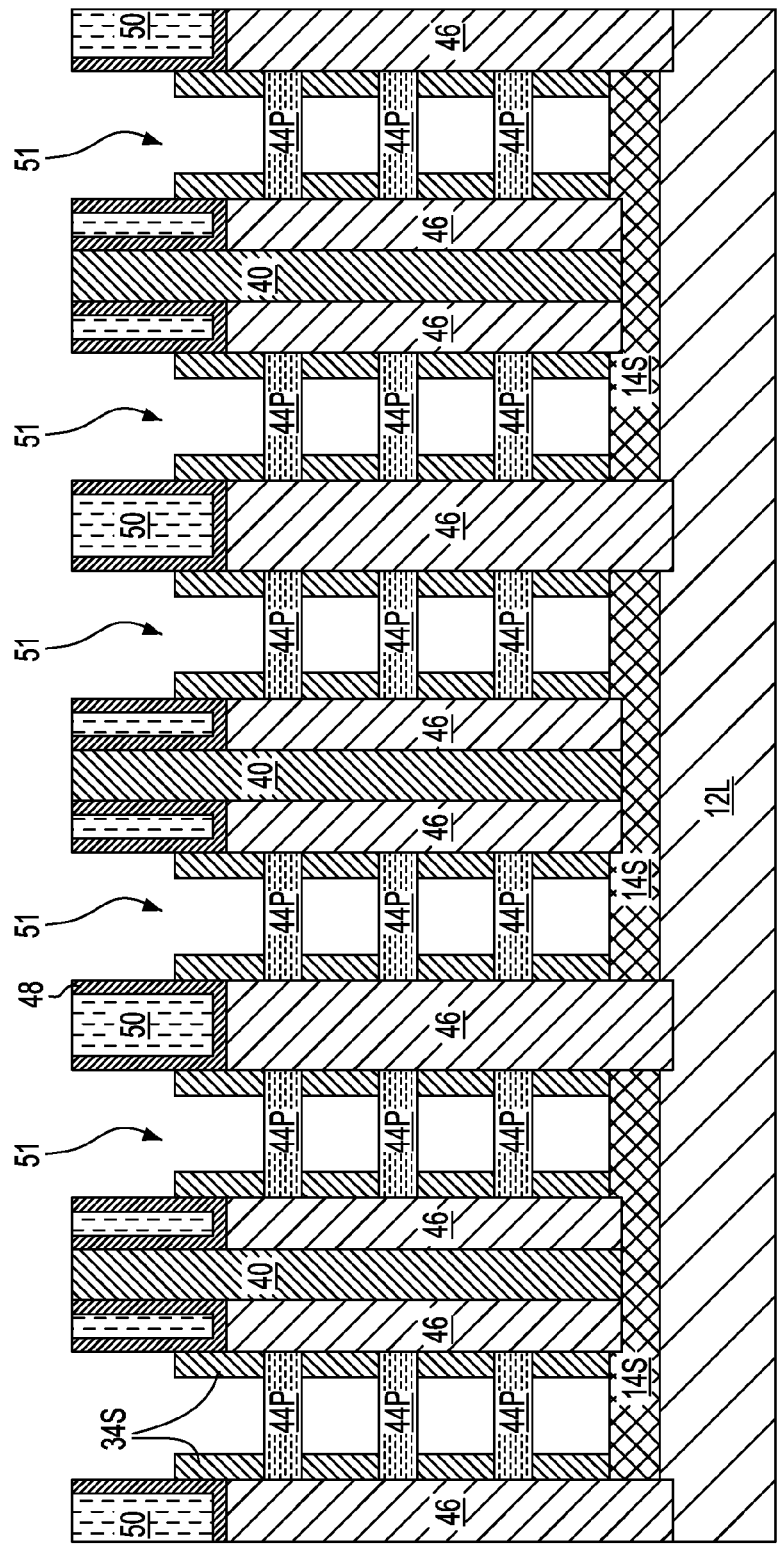
FIG. 20 is a cross sectional view of the exemplary semiconductor structure of FIG. 19 after removing remaining portions of the hard mask layer and remaining portions of the dielectric material to provide a plurality of gate cavities.

Referring now to FIG. 20, there is illustrated the exemplary semiconductor structure of FIG. 19 after removing remaining portions of the hard mask (i.e., each hard mask material nanowire portion 24F) and remaining portions of the dielectric material (i.e., each dielectric material nanowire pillar portion 22F') to provide a plurality of gate cavities 51 and to suspend a portion of each III-V or germanium semiconductor nanowire 44P. The removal of each hard mask material nanowire portion 24F and each dielectric material nanowire pillar portion 22F' may be performed utilizing one or more anisotropic etching processes that is(are) selective in removing each hard mask material nanowire portion 24F and each dielectric material nanowire pillar portion 22F'.

Figure 21:
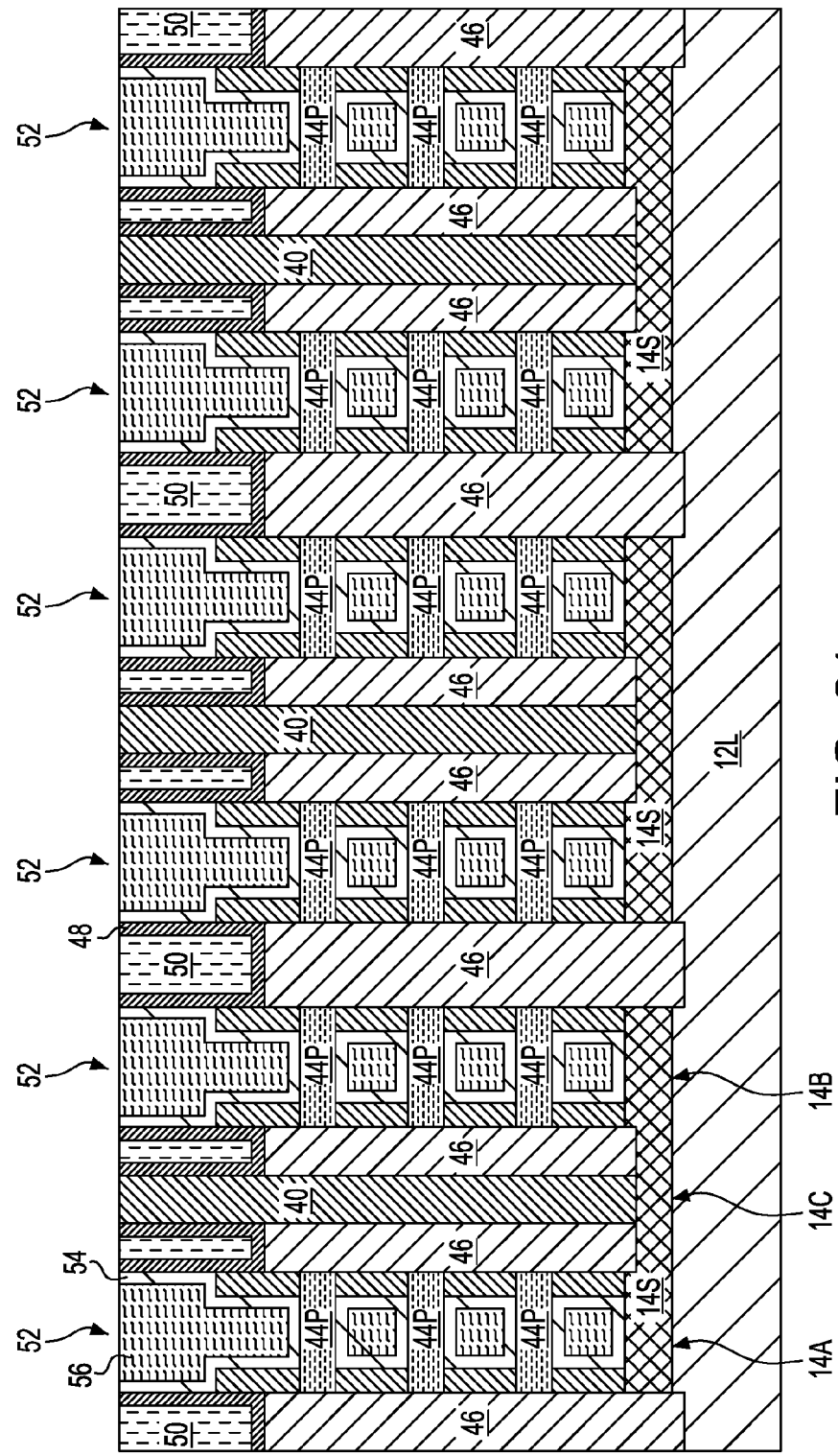
FIG. 21 is a cross sectional view of the exemplary semiconductor structure of FIG. 20 and after forming a functional gate structure in each gate cavity.

Referring now to FIG. 21, there is illustrated the exemplary semiconductor structure of FIG. 20 after forming a functional gate structure 52 in each gate cavity 51; as is shown two functional gate structures are formed atop each insulator structure 14P. Each functional gate structure 52 surrounds a portion (i.e., channel portion) of each III-V or germanium semiconductor nanowire 44P. By "functional gate structure" it is meant a permanent gate structure used to control output current (i.e., flow of carriers in the channel) of a semiconducting device through electrical or magnetic fields. Each functional gate structure 52 has a topmost surface that is coplanar with a topmost surface of the MOL dielectric material 50.

The functional gate structure 52 may include a gate dielectric portion 54 and a gate conductor portion 56. Each gate dielectric portion 54 may include a gate dielectric material. The gate dielectric material that provides each gate dielectric portion 54 can be an oxide, nitride, and/or oxynitride. In one example, each gate dielectric material that provides the gate dielectric portion 54 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the each dielectric portion 54. In some embodiments, each gate dielectric portion 54 of each functional gate structure 52 comprises a same gate dielectric material. In another embodiment, at least one of the gate dielectric portions 54 of at least one of the functional gate structures 52 comprises a different gate dielectric material than the other gate dielectric portions 54 of the other functional gate structures 52.

The gate dielectric material used in providing each gate dielectric portion 54 can be formed by any deposition process including, for example, chemical vapor deposition (CVD), plasma enhanced chemical vapor deposition (PECVD), physical vapor deposition (PVD), sputtering, or atomic layer deposition. In some embodiments, block mask technology can be used to provide a different gate dielectric material to at least one of the gate cavities 51. In one embodiment of the present application, the gate dielectric material used in providing each gate dielectric portion 54 can have a thickness in a range from 1 nm to 10 nm. Other thicknesses that are lesser than, or greater than, the aforementioned thickness range can also be employed for the gate dielectric material that may provide each gate dielectric portion 54.

Each gate conductor portion 56 can include a gate conductor material. The gate conductor material used in providing each gate conductor portion 56 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, each gate conductor portion 56 may comprise an nFET gate metal. In another embodiment, each gate conductor portion 56 may comprise a pFET gate metal. In some embodiments, at least one of the gate conductor portions 56 of at least one of the functional gate structures 52 comprises a different gate conductor material than the other gate conductor portions 56 of the other functional gate structures 52.

The gate conductor material used in providing each gate conductor portion 56 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In some embodiments, block mask technology can be used to provide a different gate conductor material to at least one of the gate cavities 51. When a metal silicide is formed, a conventional silicidation process is employed. In one embodiment, the gate conductor material used in providing each gate conductor portion 56 can have a thickness from 50 nm to 200 nm. Other thicknesses that are lesser than, or greater than, the aforementioned thickness range can also be employed for the gate conductor material used in providing each gate conductor portion 56.

Each functional gate structure 52 can be formed by providing a functional gate material stack of the gate dielectric material, and the gate conductor material. A planarization process may follow the formation of the functional gate material stack.

Notably, FIG. 21 shows a semiconductor structure in accordance with the present application. The semiconductor structure includes an insulator structure 14S located on a surface of a semiconductor material 12L and contains a first end portion 14A having a non-recessed surface, a middle portion 14C having a recessed surface, and a second end portion 14B having the non-recessed surface. A plurality of suspended and stacked III-V or germanium semiconductor nanowires 44P is located atop the first and second end portions (14A, 14B) of the insulator structure 14S. A functional gate structure 52 surrounds a portion of each suspended and stacked III-V or germanium semiconductor nanowire 44P located atop the first and second end portions (14A, 14B) of the insulator structure 14S. The structure further includes a source/drain semiconductor material structure 46 located on each side of the functional gate structure 52 and directly contacting a sidewall of each suspended and stacked III-V or germanium semiconductor nanowire 44P. Also, a barrier material 40 extends upward from the recessed surface of the insulator structure 14S and separates one of the source/drain semiconductor material structures 46 of one of the functional gate structures 52 (located atop the first end portion 14A) from another of the source/drain semiconductor material structures 46 of another of the functional gate structures 52 (located atop the second end portion 14B).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A method of forming a semiconductor structure, said method comprising:
   providing an insulator structure located on a surface of a semiconductor material and containing a first end portion having a non-recessed surface, a middle portion having a recessed surface and a second end portion having said non-recessed surface, wherein a patterned structure comprising alternating layers of dielectric material nanowire pillar portions and sacrificial material nanowire portions, and capped with a hard mask material nanowire portion, is present on each of said first and second end portions of said insulator structure;

forming a barrier material extending upwards from a portion of said recessed surface of said middle portion of said insulator structure;

removing each sacrificial material nanowire portion from said patterned structure to provide a void;

forming a III-V or germanium semiconductor nanowire in each of said voids;

epitaxially growing a source/drain semiconductor material structure from exposed sidewalls of each of said III-V or germanium semiconductor nanowires;

removing each hard mask material nanowire portion and each dielectric material nanowire pillar portion to provide a gate cavity; and forming a functional gate structure surrounding a portion of each of said III-V or germanium semiconductor nanowires in each gate cavity.

2. The method of claim 1, further comprising forming a dielectric spacer on exposed sidewalls of each of said dielectric material nanowire pillar portions prior to said forming said barrier material.

3. The method of claim 1, wherein said forming said barrier material comprises:

forming a sacrificial dielectric material completely within a first gap having a first width and located adjacent said insulator material structure, and partially within a second gap having a second width that is greater than said first width and located above said middle portion of said insulator substrate; and depositing said barrier material in a third gap located within said second gap.

4. The method of claim 1, wherein said forming said III-V or germanium semiconductor nanowire in each of said voids comprises:

epitaxially growing a III-V compound semiconductor or germanium layer from an exposed semiconductor surface of said semiconductor material; and removing exposed portions of said III-V compound semiconductor or germanium layer not within said void utilizing an anisotropic etch.

5. The method of claim 1, further comprising forming a middle-of-the-line (MOL) dielectric material atop each source/drain semiconductor material structure, said MOL dielectric material is formed prior to said removing each hard mask material nanowire portion and each dielectric material nanowire pillar portion.

6. The method of claim 5, further comprising forming a barrier liner at least between said MOL dielectric material and each source/drain semiconductor material structure.

7. The method of claim 2, wherein an outermost sidewall of said dielectric spacer is vertically aligned with an outermost surface of each of said III-V or germanium semiconductor nanowires.

8. The method of claim 1, wherein said providing said insulator structure located on said surface of said semiconductor material comprises:

forming a material stack of first sacrificial material layers and second sacrificial material layers on a surface of an insulator layer, said insulator layer is located on a handle substrate comprising said semiconductor material;

forming a hard mask layer on said material stack;

lithographically patterning said hard mask layer, said material stack and said insulator layer to provide a patterned first structure comprising a remaining portion of said insulator layer, a remaining portion of said material stack, and a remaining portion of said hard mask layer; and lithographically patterning said patterned first structure.

9. The method of claim 1, wherein a topmost surface of said barrier material is coplanar with a topmost surface of each functional gate structure.

10. The method of claim 1, wherein at least one of said source/drain semiconductor material structures has a bottommost surface that directly contacts a semiconductor surface of said semiconductor material.

\* \* \* \* \*